US011521995B2

United States Patent
Kim et al.

(10) Patent No.: US 11,521,995 B2
(45) Date of Patent: Dec. 6, 2022

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Il Nam Kim, Yongin-si (KR); Won Sang Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 392 days.

(21) Appl. No.: 16/692,239

(22) Filed: Nov. 22, 2019

(65) Prior Publication Data
US 2020/0219915 A1 Jul. 9, 2020

(30) Foreign Application Priority Data

Jan. 4, 2019 (KR) .......................... 10-2019-0001340

(51) Int. Cl.
| | |
|---|---|
| *G06V 40/12* | (2022.01) |
| *H01L 27/146* | (2006.01) |
| *H01L 25/18* | (2006.01) |
| *G06V 10/147* | (2022.01) |
| *G06V 40/13* | (2022.01) |

(52) U.S. Cl.
CPC ...... *H01L 27/14605* (2013.01); *G06V 10/147* (2022.01); *G06V 40/1318* (2022.01); *H01L 25/18* (2013.01); *H01L 27/14623* (2013.01)

(58) Field of Classification Search
CPC ......... H01L 27/14605; H01L 27/14623; H01L 25/18; G06V 40/1318; G06V 10/147
See application file for complete search history.

(56) References Cited

U.S. PATENT DOCUMENTS

| | | | |
|---|---|---|---|
| 2016/0254312 A1* | 9/2016 | Lee ................... | H01L 27/14687 382/125 |
| 2017/0017824 A1 | 1/2017 | Smith et al. | |
| 2018/0012069 A1 | 1/2018 | Chung et al. | |
| 2018/0046837 A1 | 2/2018 | Gozzini et al. | |
| 2018/0062096 A1 | 3/2018 | Li et al. | |
| 2018/0239940 A1 | 8/2018 | Kim et al. | |
| 2019/0179488 A1* | 6/2019 | Klenkler ................ | G06F 3/0412 |

(Continued)

FOREIGN PATENT DOCUMENTS

| | | | | |
|---|---|---|---|---|
| CN | 107168465 A | * | 9/2017 | ........... G06F 1/1637 |
| EP | 3267359 | | 1/2018 | |

(Continued)

OTHER PUBLICATIONS

English machine translation of CN-107168465-A (Year: 2017).*

*Primary Examiner* — Stephen G Sherman
(74) *Attorney, Agent, or Firm* — F. Chau & Associates, LLC

(57) ABSTRACT

A fingerprint sensor includes: a first layer including a plurality of pixels; a light transmitting hole array layer including a plurality of light transmitting holes providing light transmitting paths of light rays that are incident through the first layer; and a sensor layer including a plurality of photo sensors configured to sense the light rays that pass through the light transmitting holes and are incident on the sensor layer. A resolution at which the photo sensors are disposed in first areas on the sensor layer differs from a resolution at which the photo sensors are disposed in second areas on the sensor layer.

23 Claims, 15 Drawing Sheets

(56) References Cited

U.S. PATENT DOCUMENTS

2019/0180075 A1\* 6/2019 Kim .................. H04N 5/357
2020/0104562 A1   4/2020 Sung et al.

FOREIGN PATENT DOCUMENTS

| KR | 10-2017-0109651 | 9/2017 |
| KR | 10-2018-0005588 | 1/2018 |
| KR | 10-2018-0097203 | 8/2018 |
| KR | 10-2018-0122719 | 11/2018 |
| KR | 10-2020-0038388 | 4/2020 |
| WO | 2017-211152 | 12/2017 |

\* cited by examiner

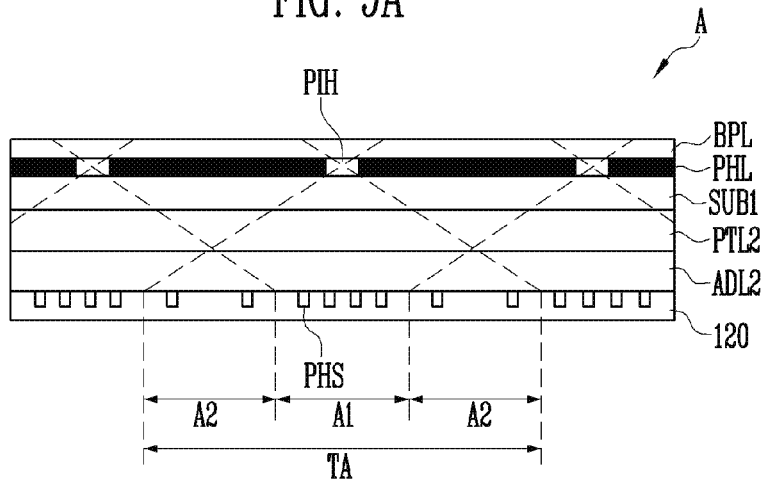
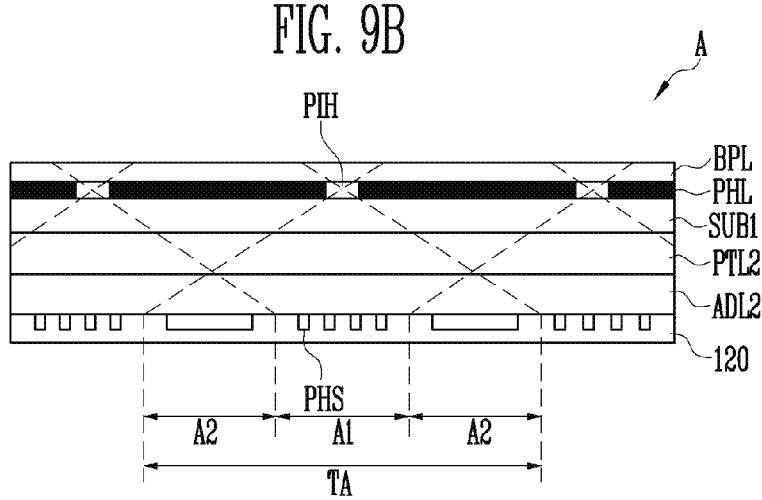
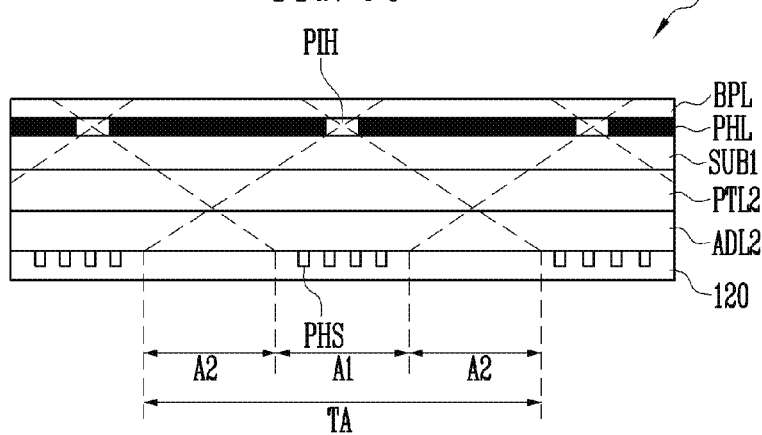

FINGERPRINT SENSOR AND DISPLAY DEVICE INCLUDING THE SAME

CROSS-REFERENCE TO RELATED APPLICATION

The present U.S. non-provisional patent application claims priority under 35 USC § 119 to Korean patent application number no. 10-2019-0001340 filed on Jan. 4, 2019, the disclosure of which is incorporated by reference in its entirety herein.

TECHNICAL FIELD

Exemplary embodiments of the inventive concept relate to a fingerprint sensor and a display device including the fingerprint sensor.

DISCUSSION OF RELATED ART

Mobile devices such as smartphones and tablet personal computers include a locking function to prevent access by unauthorized users. Examples of the locking function include requiring the user to enter a password/pin, draw a certain shape, or apply their finger to a fingerprint sensor to unlock their device. However, a user may forget their password/pin or how to draw the shape. Further, an unauthorized user can access their device if they are able to determine the password/pin or the shape. Thus, security of a mobile device can be greatly improved through use of the fingerprint sensor. A fingerprint sensor may be installed in or mounted to a display device of a mobile device to provide a fingerprint sensing function.

For example, the fingerprint sensor may be configured as an optical sensing type sensor. The optical sensing fingerprint sensor includes a light source and at least one photo sensor. However, if photo sensors are used throughout a display panel of the display device, the production cost of the display device may be unnecessarily increased.

SUMMARY

Exemplary embodiments of the inventive concept are directed to an optical sensing fingerprint sensor capable of reducing the production cost of a display device, and a display device including the fingerprint sensor.

Exemplary embodiments of the inventive concept are directed to a fingerprint sensor in which photo sensors are arranged in areas on a sensor layer at different resolutions, and a display device including the fingerprint sensor.

An exemplary embodiment of the inventive concept provides a fingerprint sensor including: a first layer including a plurality of pixels; a light transmitting hole array layer including a plurality of light transmitting holes providing light transmitting paths of light rays that are incident through the first layer; and a sensor layer including a plurality of photo sensors configured to sense the light rays that pass through the light transmitting holes and are incident on the sensor layer, wherein a resolution at which the photo sensors are disposed in first areas on the sensor layer may differ from a resolution at which the photo sensors are disposed in second areas on the sensor layer.

In an exemplary embodiment, the photo sensors are disposed at a high resolution in the first areas and disposed at a low resolution in the second areas.

In an exemplary embodiment, a pitch between the photo sensors that are disposed in the second areas is greater than a pitch between the photo sensors that are disposed in the first areas.

In an exemplary embodiment, an area of each of the photo sensors that are disposed in the second areas is greater than an area of each of the photo sensors that are disposed in the first areas.

In an exemplary embodiment, the photo sensors are not disposed in the second areas.

In an exemplary embodiment, the first areas and the second areas form target areas on which the light rays passing through the light transmitting holes are incident.

In an exemplary embodiment, the first areas are respective central areas of the target areas, and the second areas are respective perimeter areas of the target areas other than the central areas.

In an exemplary embodiment, each of the first areas at least partially overlap with a corresponding one of the light transmitting holes.

In an exemplary embodiment, the target areas at least partially overlap with each other, and the second areas are areas in which the target areas overlap with each other.

In an exemplary embodiment, the target areas do not overlap with each other, and the sensor layer further includes third areas formed in areas of the sensor layer other than the target areas.

In an exemplary embodiment, a resolution at which the photo sensors are disposed in at least one of the first, second, and third areas differ from a resolution at which the photo sensors are disposed in at least one remaining areas thereof.

In an exemplary embodiment, a resolution at which the photo sensors are disposed in each of the third areas is equal to or lower than a resolution at which the photo sensors are disposed in each of the second areas.

In an exemplary embodiment, the photo sensors are not disposed in the third areas.

In an exemplary embodiment, the first layer includes: a circuit element layer including a plurality of circuit elements constituting a pixel circuit of each of the pixels; and a light emitting element layer on which light emitting elements for the pixels are located.

In an exemplary embodiment, the photo sensors are coupled both to first sensing lines configured to receive driving signals and to second sensing lines configured to output sensing signals in response to the sensed light rays.

In an exemplary embodiment, the number of photo sensors that are electrically coupled to a first group of first sensing lines is greater than the number of photo sensors that are electrically coupled to a second group of first sensing lines. In an exemplary embodiment, the number of photo sensors that are electrically coupled to a first group of the second sensing lines is greater than the number of photo sensors that are electrically coupled to a second group of the second sensing lines.

In an exemplary embodiment, the first group of first sensing lines and the first group of second sensing lines are electrically coupled to the photo sensors that are disposed in the first areas.

In an exemplary embodiment, the first group of first sensing lines and the first group of second sensing lines electrically couple any one of the photo sensors that are disposed in each of the first areas and any one of the photo sensors that are disposed in a corresponding one of the second areas.

In an exemplary embodiment, the first group of first sensing lines and the first group of second sensing lines is bent between any one of the photo sensors that are disposed in the first area and any one of the photo sensors that are disposed in the second area.

An exemplary embodiment of the inventive concept provides a display device including: a display panel including a plurality of pixels and a light transmitting hole array layer including a plurality of light transmitting holes providing light transmitting paths of light rays that are incident from the outside; and a sensor layer disposed on one surface of the display panel and including a plurality of photo sensors configured to sense the light rays that are incident through the display panel, wherein a resolution at which the photo sensors are disposed in first areas on the sensor layer differs from a resolution at which the photo sensors are disposed in second areas on the sensor layer.

In an exemplary embodiment, the photo sensors are disposed at a high resolution in the first areas, and are disposed at a low resolution in the second areas or not disposed in the second areas.

In an exemplary embodiment, the first areas and the second areas form target areas on which the light rays passing through the light transmitting holes are incident. In an exemplary embodiment, the first areas are respective central areas of the target areas and the second areas are respective perimeter areas of the target areas other than the central areas.

In an exemplary embodiment, the target areas at least partially overlap with each other, and the second areas are areas in which the target areas overlap with each other.

In an exemplary embodiment, the target areas do not overlap with each other and the sensor layer further includes third areas formed in areas of the sensor layer other than the target areas.

In an exemplary embodiment, a resolution at which the photo sensors are disposed in at least one of the first, second, and third areas differs from a resolution at which the photo sensors are disposed in at least one remaining areas thereof.

According to an exemplary embodiment of the inventive concept, the display device further includes a driving circuit and the pixels of the display device are coupled to scan lines and data lines. In an exemplary embodiment, the driving circuit includes first through n-th scan drivers configured to supply scan signals to the pixels through the scan lines, a data driver configured to supply data signals and a bias signal to the pixels through the data lines, and a timing controller configured to supply image data and bias data to the data driver, and to sequentially supply first through nth start signals to the first through nth scan drivers, respectively. In an exemplary embodiment, the pixels are supplied with the data signals when the scan signals are supplied during display periods, and are supplied with the bias signal when the scan signals are supplied during a bias period between the display periods, and n is a natural number greater than one.

BRIEF DESCRIPTION OF THE DRAWINGS

The inventive concept will be more clearly understood by describing in detail exemplary embodiments thereof with reference to the accompanying drawings.

FIGS. 9A to 12 are enlarged sectional views illustrating exemplary embodiments of area A of FIG. 6.

DETAILED DESCRIPTION OF THE EXEMPLARY EMBODIMENTS

Figure 1:
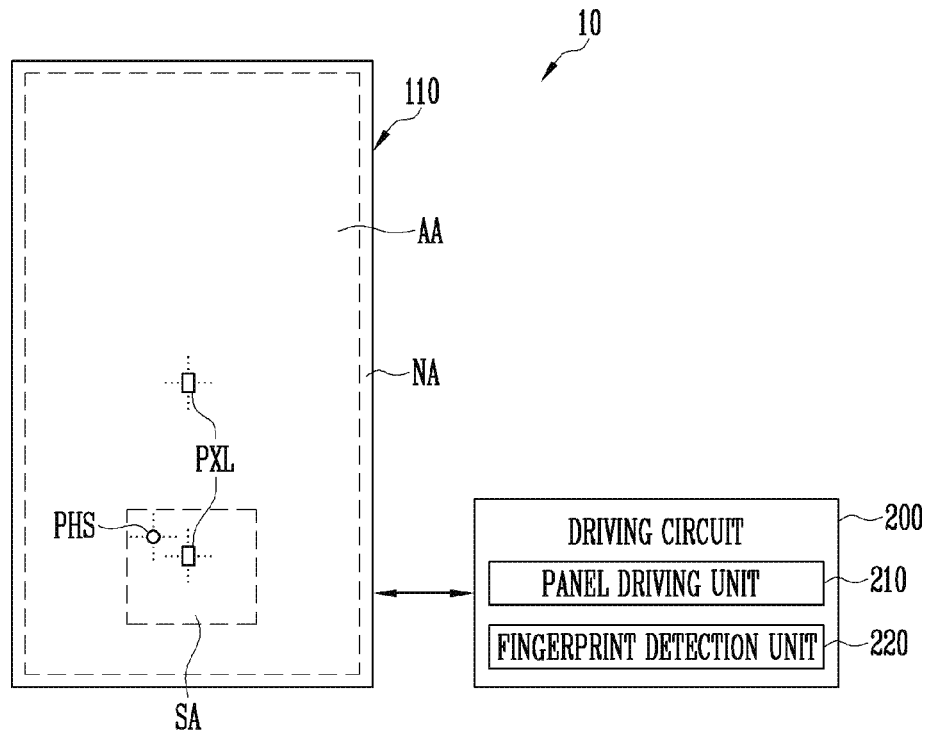
FIGS. 1 and 2 are plan views schematically illustrating a display device in accordance with an exemplary embodiment of the inventive concept.

Exemplary embodiments of the inventive concept provide an optical sensing fingerprint sensor capable of reducing the production cost of a display device, and a display device including the fingerprint sensor.

In the entire specification, when an element is referred to as being "connected" or "coupled" to another element, it can be directly connected or coupled to the another element or be indirectly connected or coupled to the another element with one or more intervening elements interposed therebetween. It will also be understood that when an element is referred to as being "between" two elements, it can be the only element between the two elements, or one or more intervening elements may also be present.

Exemplary embodiments of the inventive concept will be described more fully hereinafter with reference to the accompanying drawings. Like reference numerals may refer to like elements throughout this application.

Figure 2:
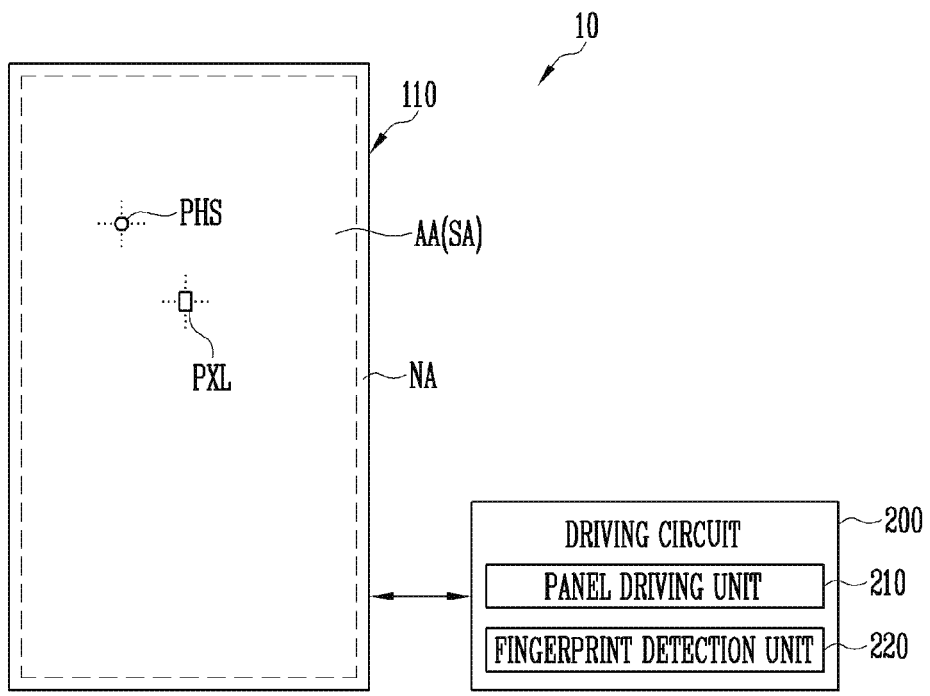

FIGS. 1 and 2 are diagrams schematically illustrating a display device 10 in accordance with an exemplary embodiment of the inventive concept. In detail, FIGS. 1 and 2 are diagrams schematically illustrating a display panel 110 and a driving circuit 200 for driving the display panel 110 that are provided in the display device 10 in accordance with an exemplary embodiment of the inventive concept. Although FIGS. 1 and 2 illustrate that the display panel 110 and the driving circuit 200 are separately provided, the inventive concept is not limited thereto. For example, the entirety or portion of the driving circuit 200 may be integrally formed on the display panel 110.

Referring to FIGS. 1 and 2, the display device 10 includes the display panel 110 and the driving circuit 200 configured to drive the display panel 110.

The display panel 110 includes a display area AA and a non-display area NA. The display area AA is an area in which a plurality of pixels PXL are provided, and may be referred to as an active area. In an exemplary embodiment, each of the pixels PXL include at least one light emitting element. For example, the light emitting element could be an organic light emitting diode. The display device 10 may drive pixels PXL in response to image data input from an external device, thus displaying an image on the display area AA. For example, the external device could be a data driving circuit.

In an exemplary embodiment of the inventive concept, the display area AA includes a sensing area SA. The sensing area SA includes at least some of the pixels PXL provided in the display area AA.

In an exemplary embodiment, as illustrated in FIG. 1, at least a portion of the display area AA is set as the sensing area SA. In an exemplary embodiment, as illustrated in FIG. 2, the entirety of the display area AA is set as the sensing area SA.

Although FIG. 1 illustrates an example where only one sensing area SA is formed on the display area AA, the technical spirit of the inventive concept is not limited thereto. In other words, in exemplary embodiments, a plurality of sensing areas SA arranged in a regular or irregular pattern may be formed on the display area AA. In these exemplary embodiments, the plurality of sensing areas SA may have identical or different areas and shapes.

Although FIG. 1 illustrates an example where the sensing area SA is formed in at least a portion of the display area AA, the technical spirit of the inventive concept is not limited thereto. In other words, in exemplary embodiments, the display area AA and the sensing area SA may be provided to overlap with each other in only some area. For example, a portion of the sensing area SA can overlap a portion of the non-display area NA while a remaining portion of the sensing area SA overlaps the display area AA.

The non-display area NA may be an area disposed around the display area AA. The non-display area NA may be referred to as a non-active area. In an exemplary embodiment, the non-display area NA comprehensively means any area of the display panel 110 except the display area AA. In an exemplary embodiment, the non-display area NA includes, for example, a line area, a pad area, and various dummy areas. For example, the line area may include signal lines such as scan lines, data lines, or sensing lines. For example, the pad area may include conductive pads to connect to one of the signal lines and to another circuit element. For example, the dummy area could include dummy pads that are not connected to any of the signal lines.

In an exemplary embodiment of the inventive concept, the display device 10 further includes a plurality of photo sensors provided in the sensing area SA. In an exemplary embodiment, the photo sensors PHS sense rays of light that are reflected by the finger of a user after being emitted from a light source, and analyze the rays of reflected light to sense the fingerprint of the user. Although hereinafter the photo sensors PHS will be described as being used for fingerprint sensing by way of example, the photo sensors PHS may be used for a variety of purposes to perform various functions, e.g., as a touch sensor and a scanner.

In an exemplary embodiment of the inventive concept, the photo sensors PHS are disposed on the sensing area SA. Here, the photo sensors PHS may overlap with at least some or all of the pixels PXL provided on the sensing area SA, or may be disposed around the pixels PXL. For example, at least some or all of the photo sensors PHS may be provided between the pixels PXL. A display device including photo sensors PHS overlapping some or all of the pixels PXL or including photo sensors PHS between the pixels may be referred to as a fingerprint sensor embedded display device when the photo sensors PHS are used to sense a fingerprint. Exemplary embodiments of the arrangement relationship between the photo sensors PHS and the pixels PXL will be described in more detail with reference to FIGS. 3A to 3E.

In an exemplary embodiment in which the photo sensors PHS are provided adjacent to the pixels PXL, the photo sensors PHS use, as a light source, a light emitting element provided in at least one pixel PXL which is disposed in or around the sensing area SA. For example, the light emitting element could be an organic light emitting diode of a pixel. In this exemplary embodiment, the photo sensors PHS, along with the pixels PXL of the sensing area SA, particularly, along with light emitting elements provided in the pixels PXL, may form a photo-sensing type fingerprint sensor. As such, in the case where the fingerprint sensor embedded display device is configured using the pixels PXL as the light source without using a separate external light source, the thicknesses of the photo-sensing type fingerprint sensor and a portion of the display device that includes the fingerprint sensor may be reduced, and the production cost may also be reduced.

In an exemplary embodiment, the photo sensors PHS are disposed both on an image display surface (e.g., a front surface) of opposite surfaces of the display panel 110, and on the other surface (e.g., a rear surface) facing away the front surface. However, the inventive concept is not limited thereto.

In an exemplary embodiment of the inventive concept, the display device 10 further includes an optical system for configuring the photo-sensing type fingerprint sensor along with the photo sensors PHS. In these exemplary embodiments, at least portion of the optical system may be formed integrally with the display panel 110. For example, the display panel 110 may be an optical-system-integrated display panel including a pinhole array layer.

The driving circuit 200 drives the display panel 110. For example, the driving circuit 200 may output a data signal corresponding to image data to the display panel 110, or may output driving signals for the photo sensors PHS and receive sensing signals from the photo sensors PHS. The driving circuit 200 that has received the sensing signals may detect a shape of the fingerprint of the user based on the sensing signals.

In an exemplary embodiment of the inventive concept, the driving circuit 200 includes a panel driving unit 210 (e.g., a panel driving circuit) and a fingerprint detection unit 220 (e.g., a fingerprint detection circuit). Although FIGS. 1 and 2 illustrate the panel driving unit 210 and the fingerprint detection unit 220 as being separately provided, the technical spirit of the inventive concept is not limited thereto. For instance, at least portion of the fingerprint detection unit 220 may be integrated with the panel driving unit 210 or interlock with the panel driving unit 210.

In an embodiment, the panel driving unit 210 successively scans the pixels PXL of the display area AA and supplies data signals corresponding to image data to the pixels PXL. Thereby, the display panel 110 may display an image corresponding to the image data. For example, the panel driving unit 210 could activate a first row of the pixels PXL and apply data signals to the activated first row during a first period, activate a second row of the pixels PXL and apply data signals to the activated second row during a first period after the second period, . . . , and activate a last row of the pixels PXL and apply data signals to the activated last row during a last period. In an exemplary embodiment, the panel driving unit 110 includes a scan driving circuit and data driving circuit (e.g., a data driver). The scan driving circuit may include a plurality of scan drivers (e.g., first through n-th scan drivers), one for each of the rows of pixels PXL. The pixels PXL may be coupled to scan lines and data lines. The scan drivers may be configured to supply scan signals to the pixels PXL through the scan lines. The data driver may be configured to supply data signals to the pixels PXL through the data lines. In an embodiment, the data driver supplies both the data signals and a bias signal to the pixels PXL through the data lines. The panel driving circuit 210 may additionally include a timing control circuit (e.g., a timing controller). The timing controller may provide image data and bias data to the data driver. The data driver can generate data signals from the image data and bias signals from the bias data. The timing controller may sequentially supply first through n-th start signals to the first to n-th scan drivers. The start signals may indicate to a given scan driver when to start outputting a given one of the scan signals. In an exemplary embodiment, the pixels PXL are supplied with the data signals when the scan signals are supplied during display periods, and are supplied with the bias signal when the scan signals are supplied during a bias period between the display periods.

In an exemplary embodiment, the panel driving unit 210 supplies driving signals for fingerprint sensing to the pixels PXL. The driving signals may be provided to cause the pixels PXL to emit light and operate as light sources for the photo sensors PHS. In this exemplary embodiment, the driving signals for fingerprint sensing may be provided to pixels PXL provided in a specific area in the display panel 110, for example, to the pixels PXL provided in the sensing area SA. In exemplary embodiments, the driving signals for fingerprint sensing may be provided by the fingerprint detection unit 220.

The fingerprint detection unit 220 may transmit driving signals for driving the photo sensors PHS to the photo sensors PHS, and detect the fingerprint of the user based on sensing signals received from the photo sensors PHS. For example, the sensing signals are received in response to transmitting the driving signals.

FIGS. 3A to 3E are plan views illustrating exemplary embodiments of an arrangement structure of the pixels PXL and the photo sensors PHS in accordance with embodiments of the inventive concept. FIGS. 3A to 3E illustrate different exemplary embodiments pertaining to relative sizes, resolutions, and arrangement relationships between at least one or more pixels PXL and photo sensors PHS which are provided in the sensing area SA.

Figure 3A:
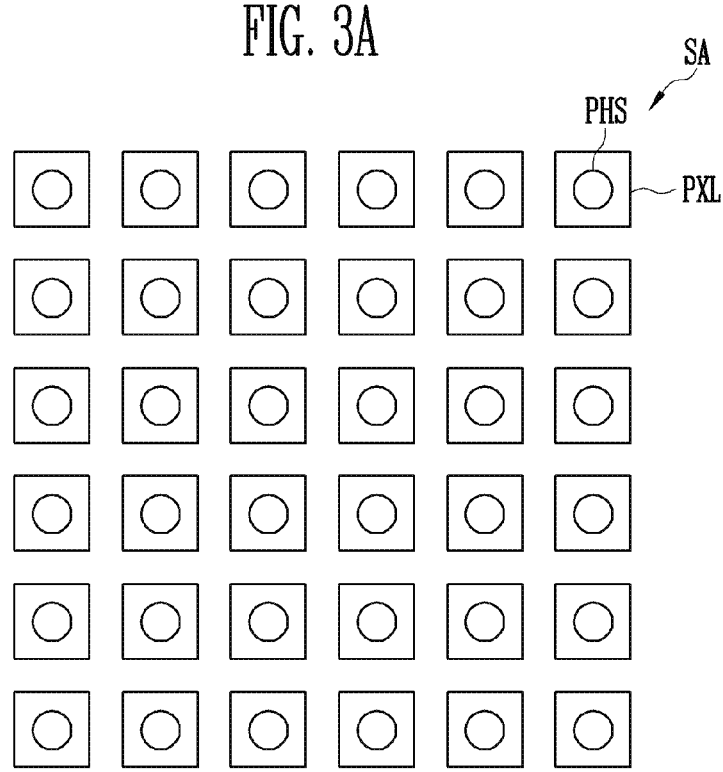
FIGS. 3A to 3E are plan views illustrating exemplary embodiments of an arrangement structure of pixels and photo sensors in accordance with an exemplary embodiment of the inventive concept.

Referring to FIG. 3A, the photo sensors PHS are disposed in the sensing area SA at the same resolution (or the same density) as that of the pixels PXL. In other words, the number of photo sensors PHS disposed in the sensing area SA is the same as that of the pixels PXL. In this exemplary embodiment, the pixels PXL and the photo sensors PHS are disposed to be paired one-to-one with each other. In the exemplary embodiment of FIG. 3A, the pixels PXL and the photo sensors PHS have been illustrated as overlapping with each other. However, in an exemplary embodiment, the pixels PXL and the photo sensors PHS do not overlap with each other, or overlap with each other only in some area.

Although in the exemplary embodiment of FIG. 3A, each photo sensor PHS has been illustrated as having a size less than that of each pixel PXL, the technical spirit of the inventive concept is not limited thereto. For example, in an exemplary embodiment, each photo sensor PHS may have a size equal to or greater than that of each pixel PXL. This exemplary embodiment is illustrated in FIG. 3E.

Referring to FIGS. 3B to 3E, the photo sensors PHS are disposed in the sensing area SA at a resolution lower than that of the pixels PXL. In other words, the number of photo sensors PHS disposed in the sensing area SA is less than that of the pixels PXL. Although FIGS. 3B to 3E illustrate examples in which one photo sensor PHS is disposed per four pixels PXL, the inventive concept is not limited thereto.

Figure 3B:
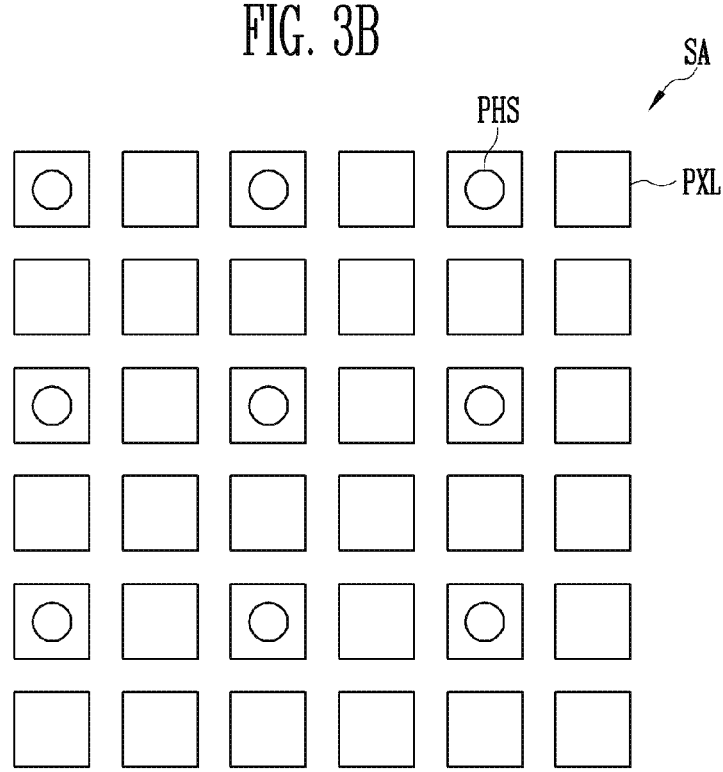
Figure 3C:
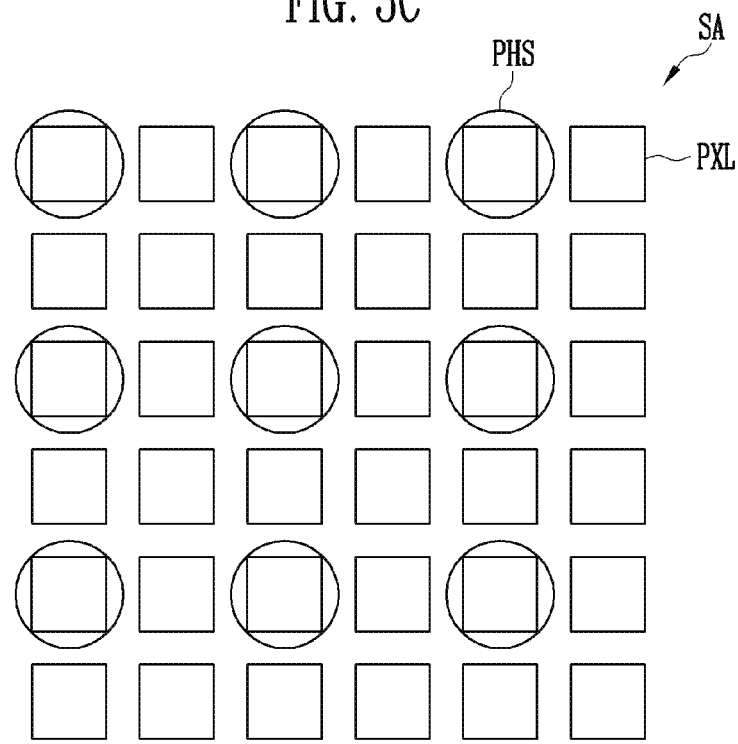
Figure 3D:
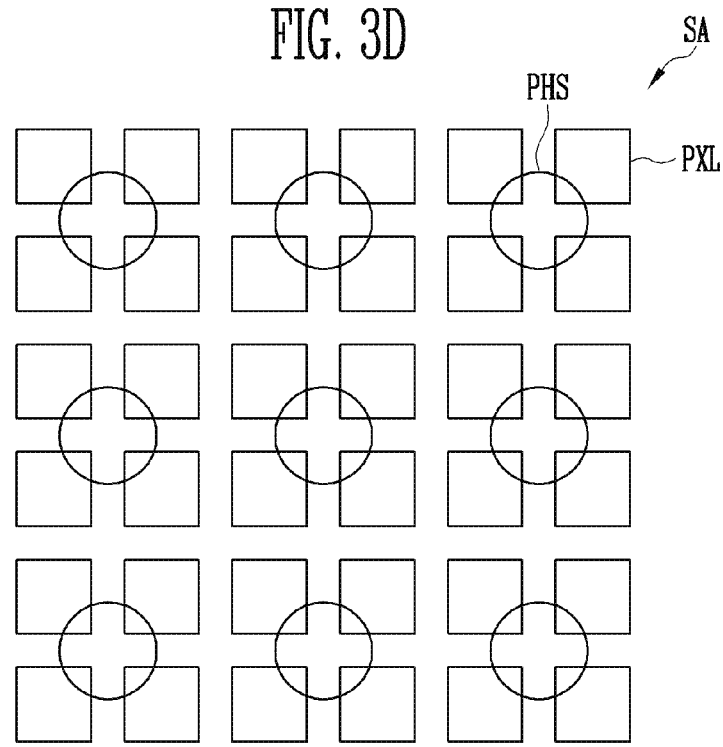
Figure 3E:
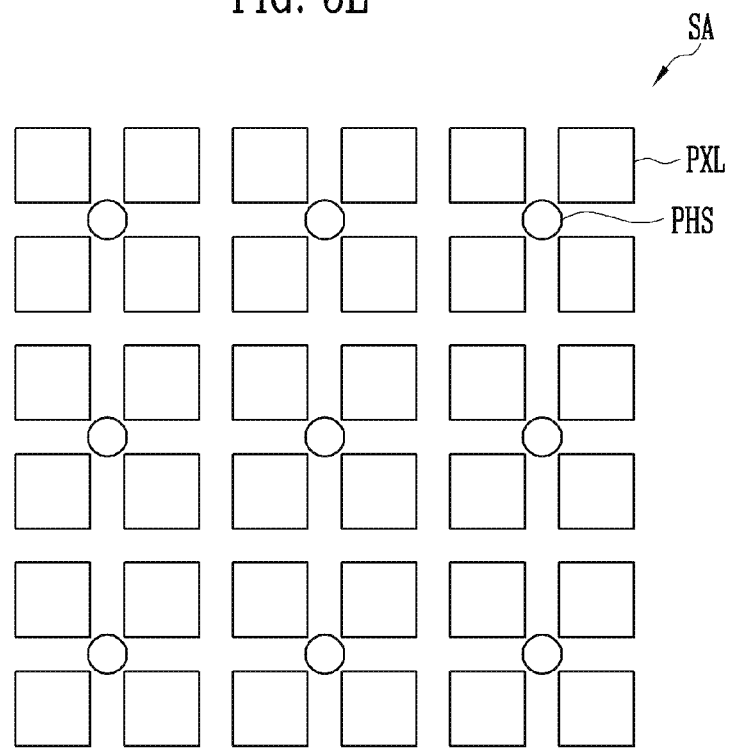

In this exemplary embodiment, as illustrated in FIGS. 3B and 3E, each photo sensor PHS has a size less than that of each pixel PXL, or, as illustrated in FIGS. 3C and 3D, each photo sensor PHS has a size greater than that of each pixel PXL.

When the photo sensors PHS are disposed at a resolution less than that of the pixels PXL, some or all of the photo sensors PHS may be disposed to overlap with the pixels PXL. In other words, as illustrated in FIGS. 3B and 3C, the photo sensors PHS may partially overlap with some of the pixels PXL.

Alternatively, as illustrated in FIG. 3D, the photo sensors PHS are disposed between the pixels PXL and partially overlap with the pixels PXL. In this exemplary embodiment, as illustrated in FIG. 3D, each photo sensor PHS has a size greater than that of each pixel PXL. For example, each photo sensor PHS may have a size appropriate to cover at least one pixel PXL.

Alternatively, as illustrated in FIG. 3E, the photo sensors PHS do not overlap with the pixels PXL.

In exemplary embodiments of the inventive concept, the arrangement structure between the pixels PXL and the photo sensors PHS is not limited to the above-mentioned arrangement structure. In other words, the shapes, the arrangement, the relative sizes, the numbers, the resolutions, etc. of the pixels PXL and the photo sensors PHS in the sensing area SA may be modified in various ways within the bounds of the technical spirit of the inventive concept. Furthermore, in exemplary embodiments, the pixels PXL and the photo sensors PHS may be disposed in the form of a combination of two or more of the exemplary embodiments of FIGS. 3A to 3E. For example, in one combination, a first part of a sensing area SA could correspond to the one to one mapping of photosensors and pixels in FIG. 3A, whereas a remaining second part of the sensing area SA corresponds to the one to four mapping of photosensors to pixels in FIG. 3B.

Although in FIGS. 3A to 3E the photo sensors PHS have been illustrated as being regularly arranged in the sensing area SA, the technical spirit of the inventive concept is not limited thereto. In exemplary embodiments, the photo sensors PHS may be irregularly arranged in the sensing area SA.

Figure 4:
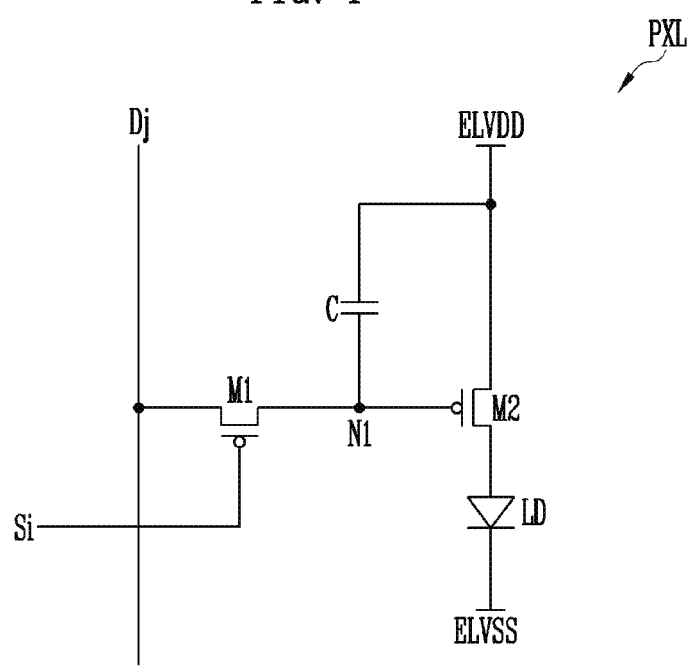
FIG. 4 is a circuit diagram illustrating an example of a pixel illustrated in FIGS. 1 to 3E in accordance with an exemplary embodiment of the inventive concept.

FIG. 4 is a circuit diagram illustrating an example of a pixel PXL illustrated in FIGS. 1 to 3E. For the sake of description, FIG. 4 illustrates an active pixel which is disposed both on an i-th scan line Si (i is a natural number) provided on an i-th horizontal pixel line and on a j-th data line Dj (j is a natural number) provided on a j-th vertical pixel line and includes two transistors. However, the structure of the pixel PXL according to the inventive concept is not limited to that illustrated in FIG. 4.

Referring to FIG. 4, the pixel PXL in accordance with an exemplary embodiment of the inventive concept includes a first transistor M1, a second transistor M2, a capacitor C, and a light emitting element LD.

The first transistor M1 is coupled between the data line Dj and a first node N1. A gate electrode of the first transistor M1 is coupled to the scan line Si. The first transistor M1 is turned on when a scan signal having a gate-on voltage (e.g., a low voltage) is supplied from the scan line Si. When the first transistor M1 is turned on, the data line Dj may be electrically coupled with the first node N1. For example, a scan driver can provide the scan signal and a data driver may provide a data voltage to the data line Dj.

The second transistor M2 is coupled between a first power supply ELVDD and the light emitting element LD. A gate electrode of the second transistor M2 is coupled to the first node N1. The second transistor M2 may control, in response to a voltage of the first node N1, the amount of current flowing from the first power supply ELVDD to a second power supply ELVSS via the light emitting element LD. In exemplary embodiments, the first power supply ELVDD is a high-potential power supply, and the second power supply ELVSS is a low-potential power supply.

The capacitor C may be coupled between the first power supply ELVDD and the first node N1. The capacitor C may store a voltage corresponding to a data signal to be supplied to the first node N1.

The light emitting element LD may be coupled between the second transistor M2 and the second power supply ELVSS. The light emitting device LD emits light at a luminance corresponding to current controlled by the second transistor M2. In an exemplary embodiment, the light emitting element LD is an organic light emitting diode (OLED).

Figure 5:
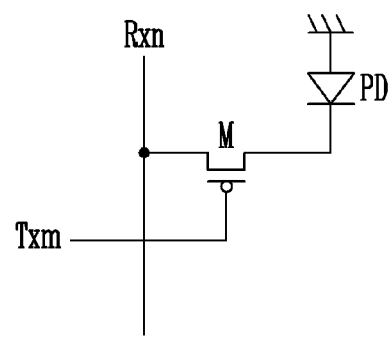
FIG. 5 is a circuit diagram illustrating an example of a photo sensor illustrated in FIGS. 1 to 3E.

FIG. 5 is a circuit diagram illustrating an example of a photo sensor PHS illustrated in FIGS. 1 to 3E. For the sake of convenience, FIG. 5 illustrates only a photo sensor PHS that is coupled to an m-th horizontal sensing line Txm (m is a natural number) and an n-th vertical sensing line Rxn (n is a natural number). In exemplary embodiments, the horizontal sensing line and the vertical sensing line may be oriented in a way different from that illustrated in FIG. 5. In these exemplary embodiments, elements constituting the photo sensor PHS may also be oriented in directions corresponding thereto.

Referring to FIG. 5, the photo sensor PHS in accordance with an exemplary embodiment of the inventive concept includes a photo diode PD and a transistor M.

The photo diode PD may be coupled between a ground and an electrode of the transistor M. The photo diode PD may be configured to convert light energy into electric energy and have photoelectromotive force of changing current depending on the intensity of light therearound.

The transistor M is coupled between an n-th vertical sensing line Rxn and the photo diode PD. A gate electrode of the transistor M is coupled to an m-th horizontal sensing line Txm. The transistor M is turned on when a driving signal having a gate-on voltage (e.g., a low voltage) is supplied to the m-th horizontal sensing line Txm. If the transistor M is turned on, current flowing through the photo diode PD may flow to the n-th vertical sensing line Rxn.

The display device 10 may apply driving signals to the horizontal sensing lines coupled to the photo sensors PHS, and sense the fingerprint of the user based on current (hereinafter, referred to as sensing signals) supplied to the vertical sensing lines.

Figure 6:
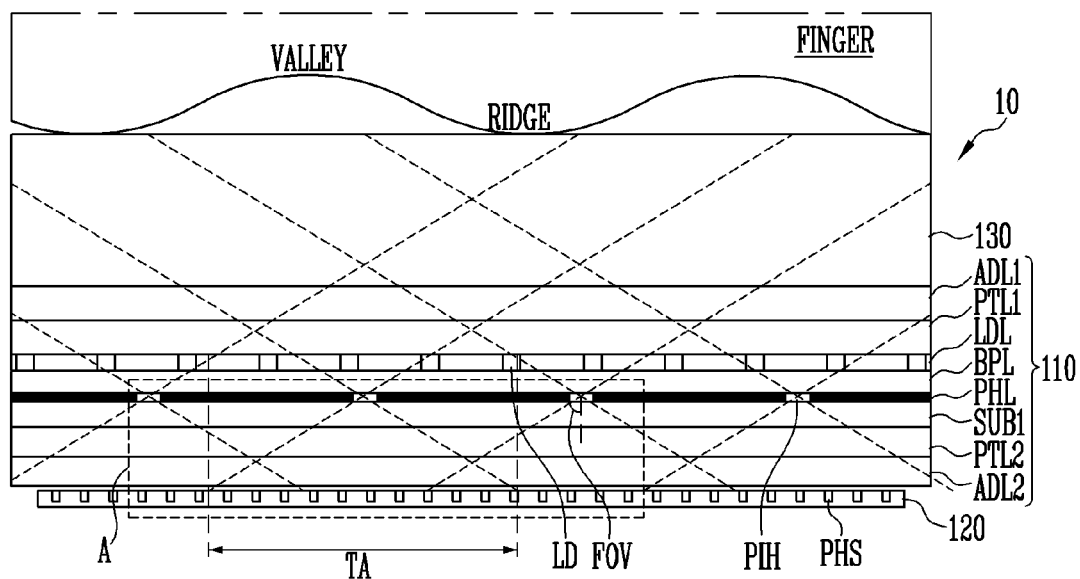
FIG. 6 is a sectional view of a display device in accordance with an exemplary embodiment of the inventive concept.
Figure 7:
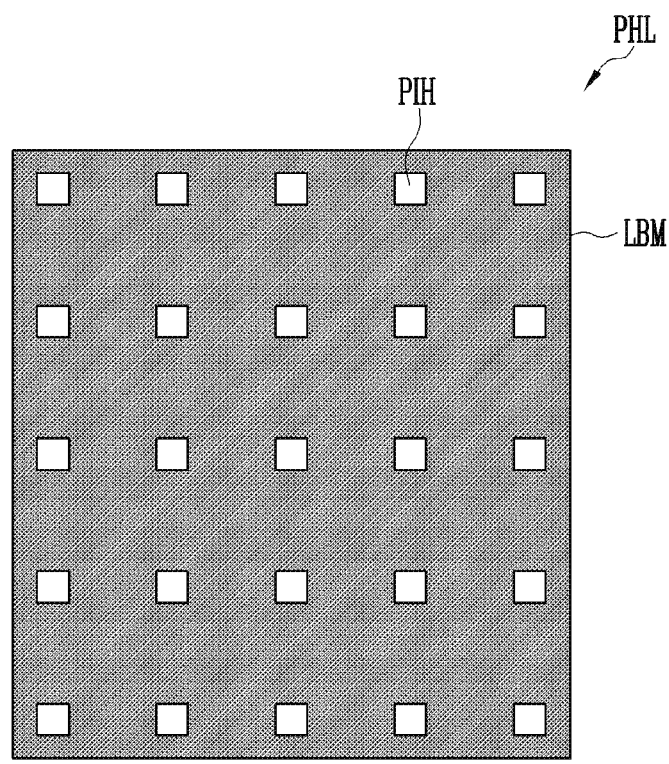
FIG. 7 is a plan view illustrating an exemplary embodiment of a pinhole array layer of FIG. 6.

FIG. 6 is a sectional view of the display device 10 in accordance with an exemplary embodiment of the inventive concept. FIG. 7 is a plan view illustrating an exemplary embodiment of a pinhole array layer PHL of FIG. 6.

Referring to FIG. 6, the display device 10 in accordance with an exemplary embodiment of the inventive concept includes a display panel 110 including a plurality of pixels PXL, a sensor layer 120 provided on one surface of the display panel 110, and a window 130 provided on the other surface of the display panel 110.

The display panel 110 may include a first substrate SUB1, a circuit element layer BPL, a light emitting element layer LDL, a first protective layer PTL1, and a first adhesive layer ADL1 which are successively disposed on a first surface (e.g., an upper surface) of the first substrate SUB1.

The first substrate SUB1 may be a base substrate of the display panel 110 and be formed of a substantially or completely transparent light-transmitting substrate. In exemplary embodiments, the first substrate SUB1 is a thin film substrate formed of polyimide (PI). In an exemplary embodiment, the first substrate SUB1 is formed of a rigid substrate including glass or tempered glass, or a flexible substrate made of plastic. However, the material of the first substrate SUB1 is not limited thereto, and the first substrate SUB may be formed of various materials. The window 130 may be formed of a same or similar material to that of the first substrate SUB1. In exemplary embodiments of the inventive concept, the first substrate SUB1 includes a display area AA and a non-display area NA, as illustrated in FIGS. 1 and 2.

The circuit element layer BPL may be disposed on the first surface of the first substrate SUB1, and may include at least one conductive layer. For example, the circuit element layer BPL may include a plurality of circuit elements which constitute a pixel circuit of each pixel PXL, and lines configured to supply power and signals for driving the pixels PXL. In this exemplary embodiment, the circuit element layer BPL may include circuit elements such as a transistor and a capacitor, and a plurality of conductive layers provided to form lines connected to the circuit elements.

The light emitting element layer LDL may be disposed on the circuit element layer BPL. In an exemplary embodiment, the light emitting element layer LDL includes a plurality of light emitting elements LD which are coupled to the circuit elements and/or the lines of the circuit element layer BPL through contact holes or the like. Such light emitting elements LD may form each pixel PXL. For example, each pixel PXL may include one of the light emitting elements LD.

In these exemplary embodiments, each of the pixels PXL may be formed of circuit elements provided in the circuit element layer BPL, and a light emitting element LD provided in the light emitting element layer LDL.

The first protective layer PTL1 may be disposed on the light emitting element layer LDL to cover the entirety or a portion of the display panel 110, for example, to cover the display area AA. In an exemplary embodiment, the first protective layer PTL1 includes a thin film encapsulation (TFE) layer or a sealing member such as an encapsulation substrate. The first protective layer PTL1 may further include a protective film or the like.

The first adhesive layer ADL1 may be disposed between the first protective layer PTL1 and the window 130 and couple the first protective layer PTL1 with the window 130. In an exemplary embodiment, the first adhesive layer ADL1 includes a transparent adhesive such as an optical clear adhesive (OCA), but the adhesive material is not limited thereto.

In an exemplary embodiment, the display panel 110 further includes a second protective layer PTL2 and a second adhesive layer ADL2 which are successively disposed on a second surface (e.g., a lower surface) of the first substrate SUB1.

The second protective layer PTL2 may be disposed on the second layer of the first substrate SUB1 and include at least one film layer such as a protective film layer.

The second adhesive layer ADL2 may be disposed between the second protective layer PTL2 and the sensor layer 120 and couple the second protective layer PTL2 with the sensor layer 120. Although the second adhesive layer ADL2 may include a transparent adhesive such as an OCA, the adhesive material is not limited thereto.

In an exemplary embodiment of the inventive concept, the display panel 110 further includes a pinhole array layer PHL. The pinhole array layer PHL may be disposed to overlap with the sensing area SA. In other words, the sensing area SA of the display device 10 may be defined in correspondence with the disposition state of the pinhole array layer PHL.

The pinhole array layer PHL is disposed between the light emitting element layer LDL and the sensor layer 120 and configured to selectively transmit incident light therethrough. In an exemplary embodiment, as illustrated in FIG. 7, the pinhole array layer PHL is formed of a light blocking mask LBM having a plurality of pinholes PIH. For example, the pinholes PIH may be through-holes of the light blocking mask LBM.

The light blocking mask LBM may be formed of an opaque metal layer which is locally open in portions thereof in which the respective pinholes PIH are formed. However, the material of the light blocking mask LBM is not limited to metal, and the light blocking mask LBM may be formed of various materials capable of blocking transmission of light. For example, the light blocking mask LBM may be formed of a black matrix material. In exemplary embodiments, the light blocking mask LBM may be rigid or flexible.

The pinholes PIH may form openings which are distributed in the light blocking mask LBM. In other words, the pinhole array layer PHL may include a plurality of pinholes PIH which have identical or different sizes and are regularly or irregularly disposed in the light blocking mask LBM at positions spaced apart from each other at identical or different pitches. For example, when a group of the pinholes PIH are spaced apart from one another at identical pitches, a given pinhole of the group is a same distance away from the pinholes it is adjacent.

The pinholes PIH may be formed to have appropriate sizes and pitches to prevent diffraction of incident light and more clearly sense the shape of the fingerprint of the user. For example, the width of each pin hole PIH may be set to a value which is ten times or more the wavelength of incident light so as to prevent diffraction of the light. For example, the width of the pinhole PIH may range from 2 µm to 15 µm.

The pitch between the pinholes PIH may be determined based on the distance between the pinhole array layer PHL and the sensor layer 120, the wavelength of incident light, and a field of view (FOV, also called "angle of view") required for each pinhole PIH. In exemplary embodiments, the angle of the FOV of the pinhole PIH may approximately range from 30° to 60°, e.g., may be 45°, but it is not limited thereto. In an exemplary embodiment, when the angle of the FOV is approximately 45°, the pitch between the pinholes PIH is set to a value two times or more the distance between the pinhole array layer PHL and the sensor layer 120, or may be set to a value or more obtained by adding a predetermined error range to the distance. For example, each pinhole PIH may have a width (or a diameter in the case of a circular shape) ranging from approximately 5 µm to approximately 15 µm along a first direction (e.g., a horizontal direction) and/or a second direction (e.g., a vertical direction) perpendicular to the first direction.

The technical spirit of the inventive concept is not limited thereto, and the size, the shape, the number, the resolution, and the arrangement of the pinholes PIH may be modified in various ways. For example, in exemplary embodiments of the inventive concept, the pinholes PIH are disposed in the light blocking mask LBM in an irregular pattern. Furthermore, the size of each pinhole PIH may be changed depending on various factors such as a wavelength bandwidth of light to be used to sense the fingerprint and the thickness of each of the layers constituting the display device 10.

Due to the pinhole array layer PHL having the above-mentioned structure, some of the light that is incident on the pinhole array layer PHL is blocked by the light blocking mask LBM, and the rest of the light passes through the pinholes PIH and reaches the sensor layer 120 disposed under the pinhole array layer PHL.

In exemplary embodiments of the inventive concept, light that is incident on the pinhole array layer PHL may be light rays (hereinafter, referred to as "reflected light rays") which are reflected by, e.g., the finger placed on the display device 10. In particular, reflected light rays which are emitted from the pixels PXL and reflected by the finger of the user may be incident on the pinhole array layer PHL. Among the incident reflected light rays, some reflected light rays that reach the light blocking mask LBM may be blocked by the light blocking mask LBM, and only some reflected light rays that are incident on the pinholes PIH may pass through the pinholes PIH and reach the sensor layer 120.

Although not illustrated, in a varying embodiment of the inventive concept, a buffer layer is further disposed on each of opposite surfaces of the pinhole array layer PHL. The buffer layer may be provided to prevent impurities from diffusing on the pinhole arrays layer PHL, and may have a single- or multi-layer structure. In the case where the buffer layer has a multi-layer structure, the multi-layers of the buffer layer may be formed of identical or different materials.

As described above, in the case where the pinhole array layer PHL is integrally provided in the display panel 110, the thickness of a portion of the display device 10 may be reduced. However, in some exemplary embodiments, the pinhole array layer PHL is separately provided under the display panel 110 rather than being integrally provided with the display panel 110. In these exemplary embodiments, the pinhole array layer PHL may be attached to a lower surface of the display panel 110 by an adhesive or the like.

In an additional exemplary embodiment of the inventive concept, the display panel 110 is transparent on areas thereof in which the pinholes PIH are disposed, so as to allow reflected light rays to pass through the corresponding pinholes PIH. In an exemplary embodiment, the display panel 110 is transparent at positions corresponding to the pinholes PIH and respective peripheral areas of the pinholes PIH so as to satisfy the required FOV of each pinhole PIH.

The sensor layer 120 may be provided on one surface of the display panel 110 such that the sensor layer 120 overlaps with at least a portion of the display panel 110. For example, the sensor layer 120 may disposed to overlap with the sensing area SA of the display panel 110.

As illustrated in FIG. 6, the sensor layer 120 may be provided on a lower surface (e.g., a surface opposite to the surface on which an image is displayed) of the display panel 110. For example, the sensor layer 120 may be implemented as a sensor integrated circuit (IC) which is attached to the lower surface of the display panel 110. In an exemplary embodiment where the sensor layer 120 is provided on the lower surface of the display panel 110, the image quality of the display device 10 may be prevented from deteriorating due to the sensor layer 120.

The sensor layer 120 includes a plurality of photo sensors PHS disposed at a predetermined resolution (density, pitch). As described with reference to FIGS. 3A to 3E, the photo sensors PHS may have various sizes, numbers, resolutions, and arrangements relative to the pixels PXL in the display panel 110.

The photo sensors PHS may output, as sensing signals, electrical signals corresponding to reflected light rays that are received after passing through the pinholes PIH. Reflected light rays that are received at the photo sensors PHS may have different light characteristics (e.g., frequencies, wavelengths, and intensities) depending on whether the reflected light rays are formed by the valleys of the fingerprint of the user or formed by the ridges of the fingerprint. Therefore, the photo sensors PHS may output sensing signals having different electrical characteristics corresponding to the light characteristics of the reflected light rays. The sensing signals output from the photo sensors PHS may be converted into image data and used to identify the fingerprint of the user.

In exemplary embodiments of the inventive concept, a reflected light ray may reach at least a portion of the sensor layer 120. Here, a portion of the sensor layer 120 on which reflected light rays that have passed through each pinhole PIH are incident may be referred to as a target area TA.

The sizes and arrangement of the target areas TA may be determined depending on the sizes, shapes, arrangement, and FOVs of the pinholes PIH, and the thicknesses of the layers disposed over the pinhole array layer PHL. In an exemplary embodiment, the target area TA has an area greater than that of a pinhole PIH. Alternatively, for example, the target area TA may have the same shape as that of a pinhole PIH. As a further alternative, for example, the target areas TA may be arranged in one-to-one correspondence with the pinholes PIH. All or some of the target areas TA may or not overlap with the pinholes PIH. However, the technical spirit of the inventive concept is not limited to those described above.

As illustrated in FIG. 6, the target areas TA corresponding to the respective pinholes PIH may overlap with each other. However, the technical spirit of the inventive concept is not limited thereto, and in exemplary embodiments, the target areas TA do not overlap with each other and are spaced apart from each other. Based on, e.g., the sizes of the pinholes PIH and the distance between the pinhole array layer PHL and the sensor layer 120, it may be determined whether the target areas TA overlap with each other.

In an exemplary embodiment of the inventive concept, the photo sensors PHS are arranged in each target area TA at different resolutions (densities, pitches). For example, the photo sensors PHS may be arranged in first areas of the target areas TA at a first resolution and in second areas thereof at a second resolution.

In an exemplary embodiment, the first areas are central areas of the target areas TA. For example, the central areas may be areas which at least partially overlap with the pinholes PIH. In an exemplary embodiment, the size of each first area is greater than that of a pinhole PIH. However, the technical spirit of the inventive concept is not limited thereto. In exemplary embodiments, the size of the first area may be equal to or less than that of a pinhole PIH. The first areas may be set to sizes and shapes large enough to identify a fingerprint using image data generated from sensing signals of the photo sensors PHS disposed in the first areas.

In an embodiment, the second areas are areas formed in the perimeters (periphery) of the target areas TA and are areas on the sensor layer 120 other than the central areas of the target areas TA. In exemplary embodiments of the inventive concept, the second areas are areas overlapping with each other between adjacent target areas TA, but the inventive concept is not limited thereto. In other words, in an exemplary embodiment where the target areas TA do not overlap with each other, the second areas are areas which do not overlap with adjacent target areas TA. In an exemplary embodiment, the first area of a target area is centrally located within the target area in a given region and the second area of the target area surrounds the given region.

In an exemplary embodiment, the first resolution is higher than the second resolution. In some exemplary embodiments, the photo sensors PHS are not disposed in the second area.

In an exemplary embodiment, the photo sensors PHS are arranged at different resolutions between the target areas TA and the other areas except the target areas TA. For example, the photo sensors PHS may be arranged in the target areas TA at a first resolution and in the other areas thereof at a second resolution. In an embodiment, the first resolution is higher than the second resolution. In some exemplary embodiments, the photo sensors PHS are not disposed in the other areas except the target areas TA.

Exemplary embodiments related to the arrangement of the photo sensors PHS will be described in more detail with reference to FIGS. 9A to 12.

The window 130 may be a protective member which is disposed on the uppermost surface of the module of the display device 10 including the display panel 110. The window 130 may be a substantially transparent light transmitting substrate. The window 130 may include a rigid or flexible substrate, and the constituent material of the window 130 is not limited to a specific material.

In an exemplary embodiment, the display device 10 further includes a polarization plate and/or a touch sensor layer (touch electrode layer) although not illustrated. The polarization plate and/or the touch sensor layer may be disposed between the first protective layer PTL1 and the window 130, but it is not limited thereto. The polarization plate may be used to polarize incident light.

Figure 8:
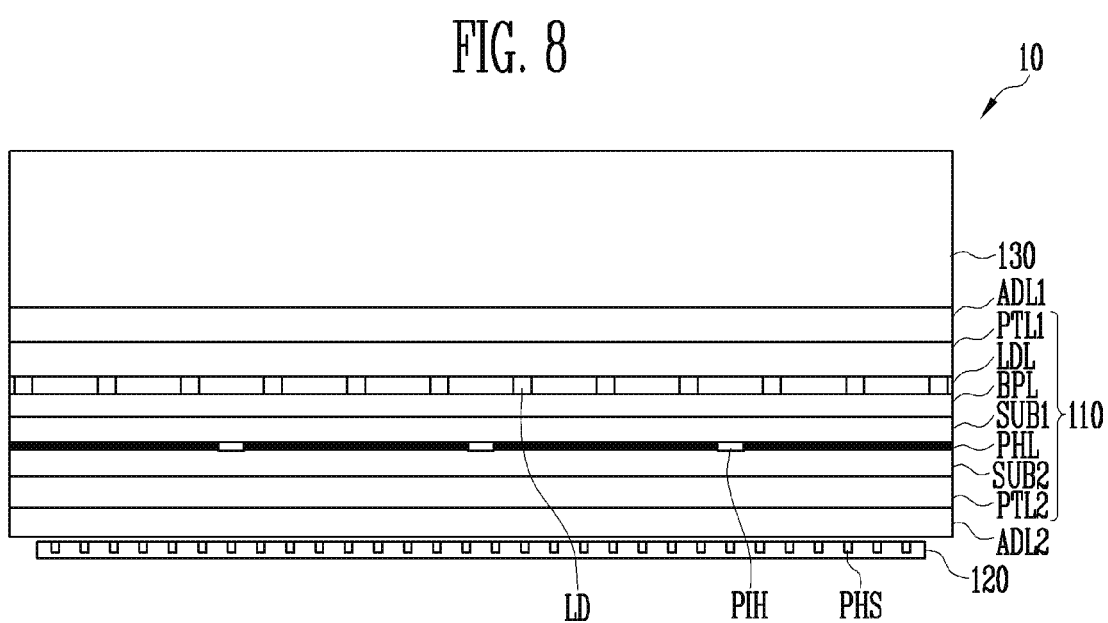
FIG. 8 is a sectional view illustrating a display device in accordance with an exemplary embodiment of the inventive concept.

FIG. 8 is a sectional view illustrating a display device 10 in accordance with an exemplary embodiment of the inventive concept. The display device 10 illustrated in FIG. 8, except the fact that it further includes a second substrate SUB2, is substantially the same as the display device 10 illustrated in FIG. 6. Hereinafter, like reference numerals are used to designate the same or similar elements as those illustrated in FIG. 6, and further explanation thereof will be omitted.

Referring to FIG. 8, the display panel 110 further includes a second substrate SUB2 disposed on the second surface (e.g., the lower surface) of the first substrate SUB1. In an exemplary embodiment, the second substrate SUB2 is disposed between the first substrate SUB1 and the sensor layer 120. In this exemplary embodiment, the pinhole array layer PHL is disposed between the first substrate SUB1 and the second substrate SUB2.

The second substrate SUB2 may be formed of material identical with or different from that of the first substrate SUB1. For example, each of the first substrate SUB1 and the second substrate SUB2 may be a thin film substrate made of polyimide.

FIGS. 9A to 12 are enlarged sectional views illustrating exemplary embodiments of area A of FIG. 6. In more detail, FIGS. 9A to 12 illustrate different exemplary embodiments related to the resolutions, sizes, and/or arrangement relationships of the photo sensors PHS provided on the sensor layer 120.

In exemplary embodiments of FIGS. 9A to 9C, target areas TA corresponding to the respective pinholes PIH at least partially overlap with each other. In these exemplary embodiments, the photo sensors PHS may be arranged at different resolutions between an area (hereinafter, referred to as a first area A1) in which target areas TA overlap with each other and an area (hereinafter, referred to as a second area A2) in which target areas TA do not overlap with each other.

Figure 12:
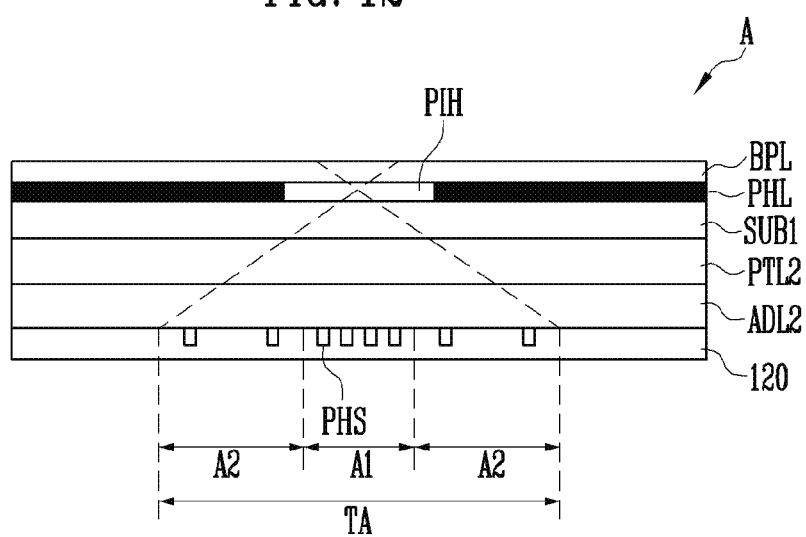

In the exemplary embodiments of FIGS. 9A to 9C, the first areas A1 at least partially overlap with the pinholes PIH. Although in FIGS. 9A to 9C each first area A1 has been illustrated as having an area greater than that of each pinhole PIH, the inventive concept is not limited thereto. In other words, in some exemplary embodiments, each first area A1 may have an area equal to or less than that of each pinhole PIH. Some of these exemplary embodiments are illustrated in FIG. 12.

Referring to FIGS. 9A to 9C, photo sensors PHS are disposed at a first resolution in the first areas A1 on the sensor layer 120, and photo sensors PHS are disposed at a second resolution in the second areas A2 on the sensor layer 120. In an embodiment, the first resolution is higher than the second resolution.

In an exemplary embodiment, as illustrated in FIG. 9A, the photo sensors PHS that are disposed in the second areas A2 are arranged at pitches greater than that of the photo sensors PHS disposed in the first areas A1, thus implementing a low resolution structure. In an embodiment, a given photosensor in a second area A2 is a same first distance away from the photosensors PHS it is adjacent in the second area A2, a given photosensor in a first area A1 is a same second distance away from the photosensors PHS it is adjacent in the first area A1, and the first distance is greater than the second distance. In this exemplary embodiment, the photo sensors PHS that are disposed in the second area A2 may be arranged to be disposed collinearly with at least some of the photo sensors PHS that are disposed in the first areas A1, but the technical spirit of the inventive concept is not limited thereto. In other words, for example, the photo sensors PHS that are disposed in the second areas A2 may be aligned with spaces between the photo sensors PHS that are disposed in the first areas A1.

In an exemplary embodiment, as illustrated in FIG. 9B, each of the photo sensors PHS that are disposed in the second areas A2 has a width greater than that of each of the photo sensors PHS disposed in the first areas A1, thus implementing a low resolution structure. For example, in the exemplary embodiment of FIG. 9B, a photo diode of each of the photo sensors PHS disposed in the second areas A2 has an area greater than that of a photo diode of each of the photo sensors PHS disposed in the first areas A1. However, the technical spirit of the inventive concept is not limited thereto. In an exemplary embodiment, each of the photo sensors PHS disposed in the second areas A2 are manufactured to have a relatively large area in such a way that the circuit elements thereof are disposed at pitches greater than that of each of the photo sensors PHS disposed in the first areas A1.

In exemplary embodiments of the inventive concept, as illustrated in FIG. 9C, the photo sensors PHS are not disposed in the second areas A2.

Figure 10:
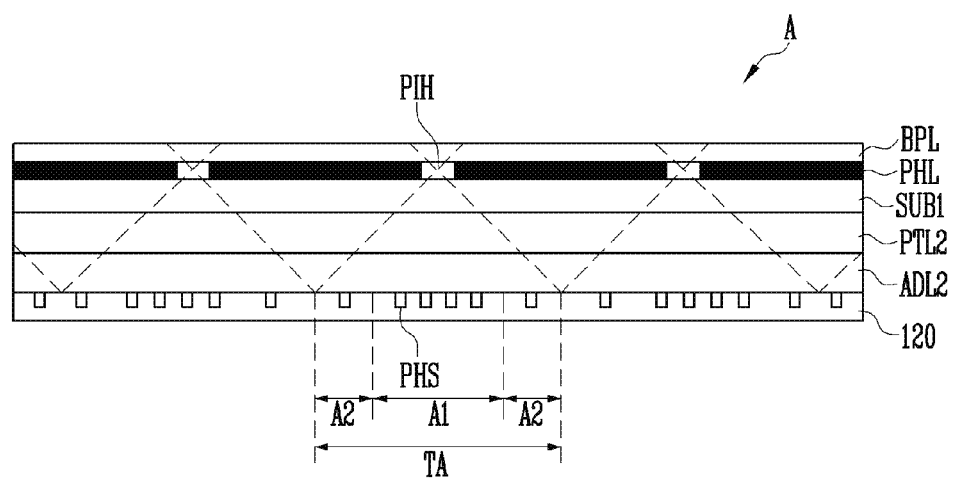

In the exemplary embodiment of FIG. 10, the target areas TA corresponding to the respective pinholes PIH come into contact with each other without overlapping with each other. In this exemplary embodiment, the first areas A1 have sizes and shapes large enough to identify the fingerprint based on image data generated from sensing signals of the photo sensors PHS disposed in the first areas A1. The second areas A2 may be set to areas on the sensor layer 120 other than the first areas A1. Here, the first areas A1 may at least partially overlap with the pinholes PIH.

Referring to FIG. 10, photo sensors PHS are disposed at a first resolution in the first areas A1 on the sensor layer 120, and photo sensors PHS are disposed at a second resolution in the second areas A2 on the sensor layer 120. Here, the first resolution is higher than the second resolution.

Although FIG. 10 illustrates an example where the photo sensors PHS are disposed at a comparatively high resolution in the first areas A1 and at a comparatively low resolution in the second areas A2 and have the same area, the technical spirit of the inventive concept is not limited thereto. In other words, in exemplary embodiments in which the target areas TA corresponding to the respective pinholes PIH do not overlap with each other, the photo sensors PHS that are disposed in the second areas A2 may have areas greater than that of the photo sensors PHS that are disposed in the first areas A1. Alternatively, in exemplary embodiments in which the target areas TA corresponding to the respective pinholes PIH do not overlap with each other, the photo sensors PHS are not disposed in the second areas A2. These exemplary embodiments are the same as those described with reference to FIGS. 9A to 9C; therefore, further explanation thereof will be omitted.

Figure 11A:
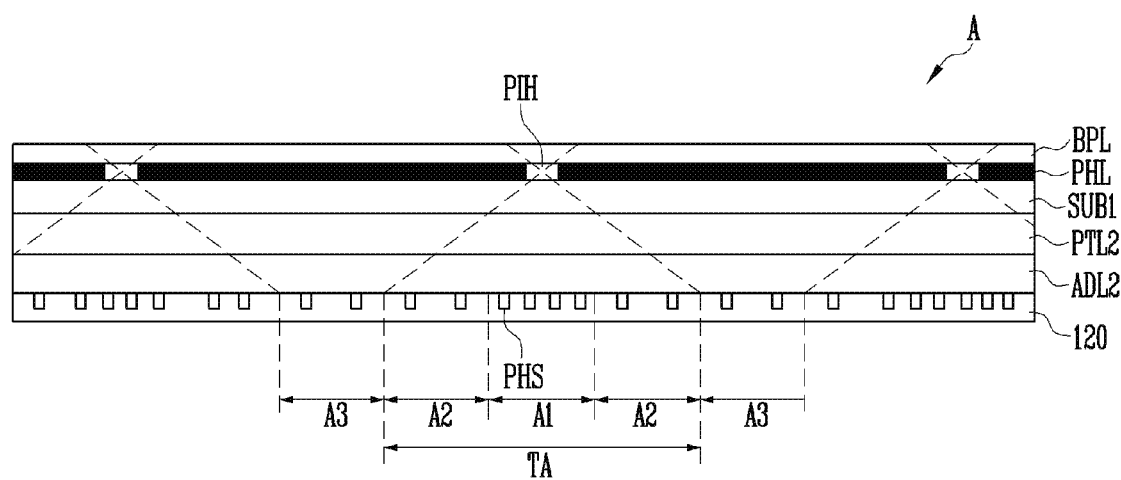
Figure 11B:
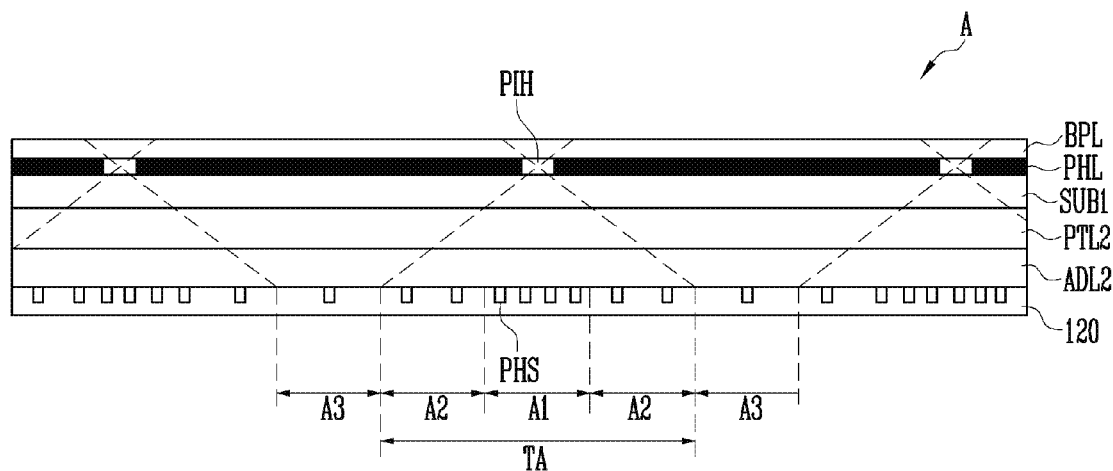
Figure 11C:
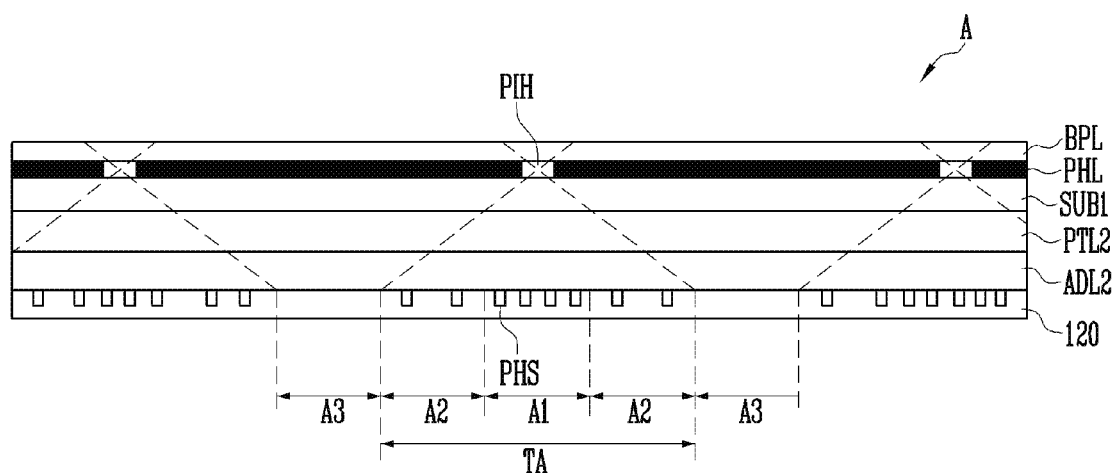

In exemplary embodiments of FIGS. 11A to 11C, target areas TA corresponding to the respective pinholes PIH are spaced apart from each other. In these exemplary embodiments, the first areas A1 have sizes and shapes large enough to identify the fingerprint based on image data generated from sensing signals of the photo sensors PHS disposed in the first areas A1. The second areas A2 may be set to areas on the target areas TA other than the first areas A1. Here, an area (hereinafter, referred to as a third area A3) between the target areas TA may have various shapes and sizes depending on the sizes and arrangements of the pinholes PIH, and the distance between the pinhole array layer PHL and the sensor layer 120.

In exemplary embodiments of FIGS. 11A to 11C, the photo sensors PHS corresponding to each of the pinholes PIH may have different resolutions between at least two areas of the first area A1, the second area A2, and the third area A3.

In an exemplary embodiment, as illustrated in FIG. 11A, the photo sensors PHS are disposed at a first resolution in the first areas A1 and at a second resolution in the second areas A2 and the third areas A3. Here, the first resolution is higher than the second resolution.

In an exemplary embodiment, as illustrated in FIG. 11A, the photo sensors PHS that are disposed in the second areas A2 and the third areas A3 are arranged at pitches greater than that of the photo sensors PHS disposed in the first areas A1, thus implementing a low resolution structure. In this exemplary embodiment, the photo sensors PHS that are disposed in the second area A2 and the third areas A3 may be arranged to be disposed collinearly with at least some of the photo sensors PHS disposed in the first areas A1, but the technical spirit of the inventive concept is not limited thereto. In other words, for example, the photo sensors PHS that are disposed in the second areas A2 and the third areas A3 may be aligned with spaces between the photo sensors PHS that are disposed in the first areas A1.

In an exemplary embodiment, each of the photo sensors PHS that are disposed in the second areas A2 and the third areas A3 is manufactured to have an area greater than that of each of the photo sensors PHS disposed in the first areas A1, thus implementing a low resolution structure. Detailed descriptions of this exemplary embodiment are the same as that described with reference to FIG. 9B; therefore, further explanation thereof will be omitted.

In an exemplary embodiment, as illustrated in FIG. 11B, the photo sensors PHS are disposed at a first resolution in the first areas A1, at a second resolution in the second areas A2, and at a third resolution in the third areas A3. Here, the first resolution is higher than the second resolution, and the second resolution is higher than the third resolution.

In an exemplary embodiment, as illustrated in FIG. 11B, the photo sensors PHS that are disposed in the third areas A3 are disposed at pitches greater than that of the photo sensors PHS disposed in the second areas A2, thus implementing a low resolution structure. In this exemplary embodiment, the photo sensors PHS that are disposed in the third area A3 may be arranged to be disposed collinearly with at least some of the photo sensors PHS that are disposed in the second areas A2, but the technical spirit of the inventive concept is not limited thereto. In other words, for example, the photo sensors PHS that are disposed in the third areas A3 may be aligned with spaces between the photo sensors PHS that are disposed in the second areas A2.

In this exemplary embodiment, the photo sensors PHS that are disposed in the third areas A3 may be aligned with at least some of the photo sensors that are disposed in the first areas A1 or with spaces between the photo sensors that are disposed in the first areas A1, depending on alignment between the photo sensors PHS that are disposed in the first areas A1 and the photo sensors PHS that are disposed in the second areas A2.

In an exemplary embodiment, each of the photo sensors PHS that are disposed in the third areas A3 are manufactured to have an area greater than that of each of the photo sensors PHS disposed in the second areas A2, thus implementing a low resolution structure. Detailed descriptions of this exemplary embodiment are the same as that described with reference to FIG. 9B; therefore, further explanation thereof will be omitted.

In an exemplary embodiment, the photo sensors PHS are not disposed in at least one of the second area A2 and the third area A3. Although FIG. 11C illustrates an example where the photo sensors PHS are present in the second area A2 and not present in the third area A3, the technical spirit of the inventive concept is not limited thereto. For example, in another embodiment the photo sensors PHS are not present in the second area and present in the third area A3, and in yet another embodiment the photosensors PHS are not present in the second area A2 and not present in the third area A3.

In an exemplary embodiment of FIG. 12, each first area A1 has a size (an area, a width, and a diameter) less than that of each pinhole PIH. In this exemplary embodiment, each second area A2 may partially overlap with the pin hole PIH. For example, in the case where the target area TA is larger than the pinhole PIH, the second area A2 may partially overlap with the pinhole PIH. Alternatively, for example, in the case where the target area TA is smaller than the pinhole PIH, the entirety of the second area A2 may overlap with the pinhole PIH.

Referring to FIG. 12, photo sensors PHS are disposed at a first resolution in the first areas A1 on the sensor layer 120, and photo sensors PHS are disposed at a second resolution in the second areas A2 on the sensor layer 120. Here, the first resolution is higher than the second resolution.

The technical spirit of the inventive concept is not limited to that illustrated in FIG. 12. In other words, in an exemplary embodiment in which the first area A1 is smaller than the pinhole PIH, the photo sensors PHS may be arranged in various ways, as described with reference to FIGS. 9A to 11C. Detailed descriptions of these exemplary embodiments are the same as those described with reference to FIGS. 9A to 11C; therefore, further explanation thereof will be omitted.

As illustrated in FIGS. 9A to 12, if the photo sensors PHS are disposed at a low resolution in some areas on the sensor layer 120, the production cost of the sensor layer 120 may be reduced, and the production cost of the display device 10 may be consequently reduced.

In exemplary embodiments of the inventive concept, a method of arranging the photo sensors PHS is not limited to those described above. In other words, in exemplary embodiments of the inventive concept, the arrangements and sizes of the photo sensors PHS relative to the pinholes PIH may be modified in various ways so long as the photo sensors PHS are arranged at different resolutions between different areas in the sensor layers 120.

Figure 13:
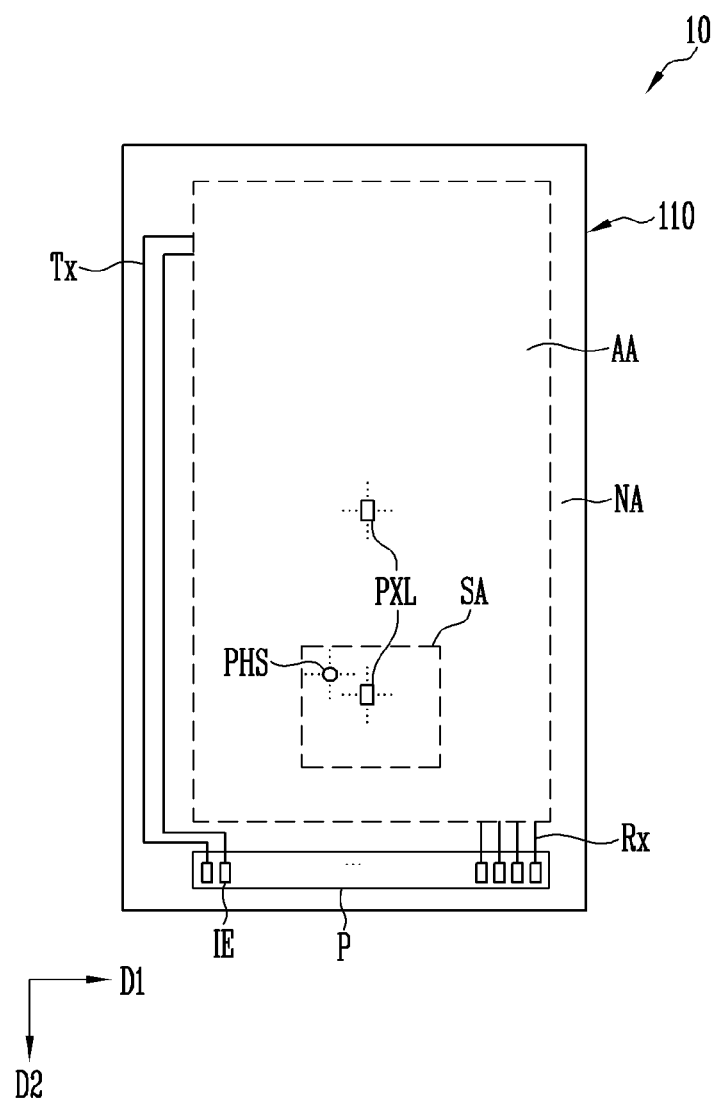
FIG. 13 is a plan view schematically illustrating a display device in accordance with an exemplary embodiment of the inventive concept.

FIG. 13 is a plan view schematically illustrating a display device 10 in accordance with an exemplary embodiment of the inventive concept.

The display device 10 of FIG. 13 further includes a pad unit P, compared to that illustrated in FIG. 1. A plurality of electrodes IE which are electrically coupled with the photo sensors PHS may be formed in the pad unit P. In exemplary embodiments, some of the electrodes IE are coupled to horizontal sensing lines Tx, and some of the electrodes IE are coupled to vertical sensing lines Rx. In an exemplary embodiment, some of the electrodes IE may be provided as dummy electrodes which are coupled neither to the horizontal sensing lines Tx nor to the vertical sensing lines Rx.

In exemplary embodiments, the pad unit P may include the driving circuit 200 illustrated in FIGS. 1 and 2 or be coupled to the driving circuit 200. Driving signals output from the fingerprint detection unit 220 of the driving circuit 200 may be transmitted to the horizontal sensing lines Tx through the electrodes IE of the pad unit P. Sensing signals output through the vertical sensing lines Rx may be transmitted to the fingerprint detection unit 220 of the driving circuit 200 through the electrodes IE of the pad unit P.

The horizontal sensing lines Tx are electrically coupled to a plurality of photo sensors PHS that are arranged in a horizontal direction (a first direction D1) on the display area AA. In exemplary embodiments, the horizontal sensing lines Tx may supply driving signals received from the electrodes IE to the photo sensors PHS coupled to the horizontal sensing lines Tx.

The vertical sensing lines Rx are electrically coupled to a plurality of photo sensors PHS that are arranged in a vertical direction (a second direction D2) on the display area AA. In exemplary embodiments, the vertical sensing lines Rx may receive sensing signals output from the photo sensors PHS and transmit the received sensing signals to the electrodes IE.

In the display device 10 having the above-mentioned configuration, the photo sensors PHS may be disposed at intersections between the horizontal sensing lines Tx and the vertical sensing lines Rx. The photo sensors PHS may be configured to be turned on when driving signals are received from the horizontal sensing lines Tx, and configured to output sensing signals in response to the driving signals and the quantity of light that is incident on the photo sensors PHS.

In exemplary embodiment of the inventive concept, the number of photo sensors PHS that are electrically coupled to a first group of horizontal sensing lines Tx may be greater (or less) than that coupled to a second group of horizontal sensing lines Tx. Furthermore, in exemplary embodiment of the inventive concept, the number of photo sensors PHS that are electrically coupled to a first group of vertical sensing lines Rx may be greater (or less) than that coupled to a second group of vertical sensing lines Rx.

The technical spirit of the inventive concept is not limited to those described above. In exemplary embodiments, the numbers of photo sensors PHS that are electrically coupled to the first and second groups of horizontal sensing lines Tx may be the same as each other, and the numbers of photo sensors PHS that are electrically coupled to the first and second groups of vertical sensing lines Rx may also be the same as each other. In this exemplary embodiment, the first and second groups of horizontal sensing lines Tx may be spaced apart from each other, and the first and second groups of vertical sensing lines Rx may be spaced apart from each other. However, the technical spirit of the inventive concept is not limited thereto.

Exemplary embodiments related to connection relationships between the horizontal sensing lines Tx, the vertical sensing lines Rx, and the photo sensors PHS are illustrated in FIGS. 14A to 14D.

In exemplary embodiments of the inventive concept, the arrangement of the horizontal sensing lines Tx and the vertical sensing line Rx is not limited to that illustrated in FIG. 13. In other words, the terms "horizontal" and "vertical" used in this specification are only to distinguish relative arrangements thereof. The horizontal sensing lines Tx are not necessarily required to extend in the first direction (e.g., a horizontal direction), and the vertical sensing lines Rx are also not necessarily required to extend in the second direction (e.g., a vertical direction). Hence, in exemplary embodiments of the inventive concept, the horizontal sensing lines Tx may extend in the second direction, and the vertical sensing lines Rx may extend in the first direction.

FIGS. 14A to 14D are plan views illustrating a portion of the sensing area SA of FIG. 13 according to an exemplary embodiment of the inventive concept. Particularly, FIGS. 14A to 14D illustrate exemplary embodiments related to connection relationships between the horizontal sensing lines Tx, the vertical sensing lines Rx, and the photo sensors PHS.

In an exemplary embodiment of the inventive concept, the number of photo sensors PHS that are electrically coupled to a first group of horizontal sensing lines Tx may be greater (or less) than that coupled to a second group of horizontal sensing lines Tx. Furthermore, in an exemplary embodiment of the inventive concept, the number of photo sensors PHS that are electrically coupled to a first group of vertical sensing lines Rx may be greater (or less) than that coupled to a second group of vertical sensing lines Rx.

The technical spirit of the inventive concept is not limited to those described above. In exemplary embodiments, the numbers of photo sensors PHS that are electrically coupled to the first and second groups of horizontal sensing lines Tx may be the same as each other, and the numbers of photo sensors PHS that are electrically coupled to the first and second groups of vertical sensing lines Rx may also be the same as each other. In this exemplary embodiment, the first and second groups of horizontal sensing lines Tx may be spaced apart from each other, and the first and second groups of vertical sensing lines Rx may be spaced apart from each other.

Referring to FIGS. 14A to 14D, m-th to m+5-th horizontal sensing lines Txm to Txm+5 and n-th to n+5-th vertical sensing lines Rxn to Rxn+5 are disposed in the sensing area SA. Photo sensors PHS are disposed at intersections between the horizontal sensing lines Tx and the vertical sensing lines Rx.

In exemplary embodiments of FIGS. 14A to 14D, the first group of horizontal sensing lines Tx includes the m+1-th to m+4-th horizontal sensing lines Txm+1 to Txm+4, and the second group of horizontal sensing lines Tx includes the m-th and m+5-th horizontal sensing lines Txm and Txm+5. In exemplary embodiments of the inventive concept, the number of photo sensors PHS that is coupled to the first group of horizontal sensing lines Tx is greater than that coupled to the second group of horizontal sensing lines Tx.

In these exemplary embodiments, the first group of horizontal sensing lines Tx may at least partially overlap with the first areas A1 illustrated in FIGS. 9A to 12. Furthermore, the second group of horizontal sensing lines Tx do not overlap with the first areas A1 illustrated in FIGS. 9A to 12. However, the technical spirit of the inventive concept is not limited thereto. In other words, the second group of horizontal sensing lines Tx may also at least partially overlap with the first areas A1 illustrated in FIGS. 9A to 12. However, in this exemplary embodiment, the area in which the first group of horizontal sensing lines Tx overlaps with the first areas A1 is greater than the area in which the second group overlaps with the first areas A1.

As described above, the number of photo sensors PHS disposed in the first areas A1 on the sensor layer 120 is greater than that in the second areas A2. Therefore, the number of photo sensors PHS that are coupled to the first group of horizontal sensing lines Tx that overlaps with the first areas A1 is greater than that coupled to the second group of horizontal sensing lines Tx that does not overlap with the first areas A1 or is less in the overlapping area than the first group of horizontal sensing lines Tx.

Figure 14A:
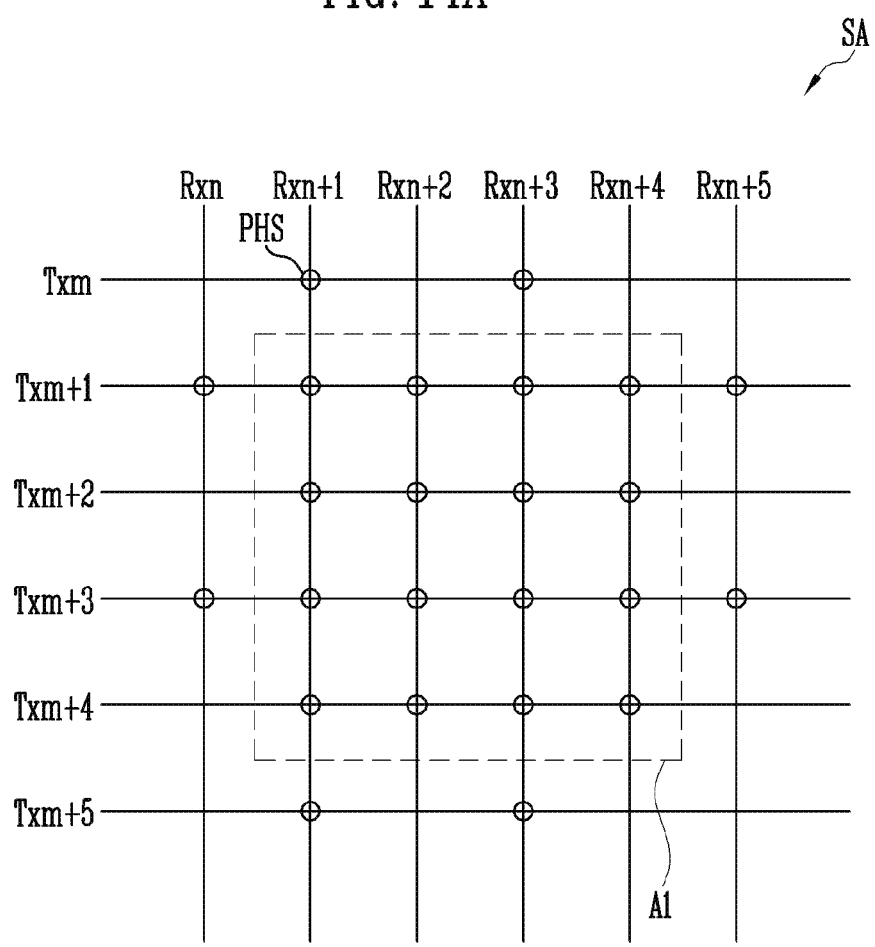
FIGS. 14A to 14D are plan views illustrating, in more detail, a portion of a sensing area of FIG. 13 in accordance with an exemplary embodiment of the inventive concept.

In an exemplary embodiment of the inventive concept, in the case where the photo sensors PHS that are disposed in the second areas A2 are aligned with some of the photo sensors PHS that are disposed in the first areas A1, the first group of horizontal sensing lines Tx may extend in the horizontal direction without bending, as illustrated in FIG. 14A.

Figure 14B:
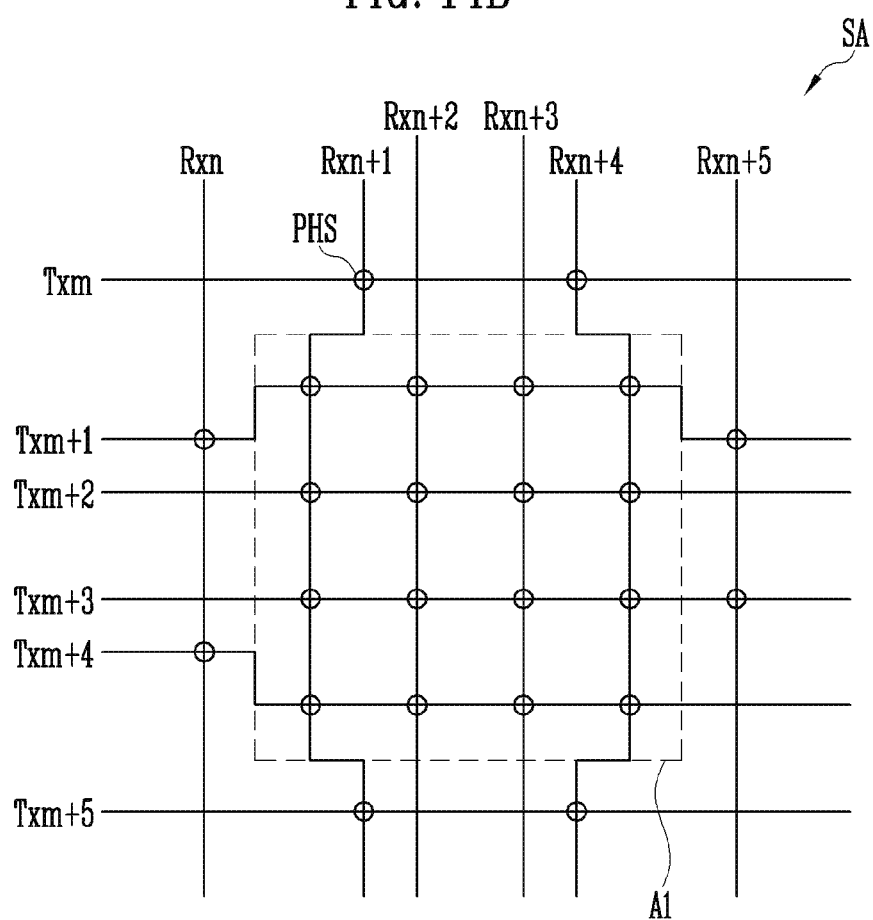

In an exemplary embodiment of the inventive concept, in the case where the photo sensors PHS that are disposed in the second areas A2 are not aligned with the photo sensors PHS that are disposed in the first areas A1, the first group of horizontal sensing lines Tx may be bent in at least an area, as illustrated in FIG. 14B. In other words, in this exemplary embodiment, the first group of horizontal sensing lines Tx may be bent in at least an area so as to couple the photo sensors PHS that are disposed in the first areas A1 and the second areas A2.

Bent portions of the horizontal sensing lines Tx may be formed in boundaries between the first areas A1 and the second areas A2. However, the technical spirit of the inventive concept is not limited thereto. For example, the first group of horizontal sensing lines Tx may be formed in curved shapes in the boundaries between the first areas A1 and the second areas A2. Alternatively, the first group of horizontal sensing lines Tx may be bent or formed in curved shapes in other areas rather than the boundaries between the first areas A1 and the second areas A2.

Figure 14C:
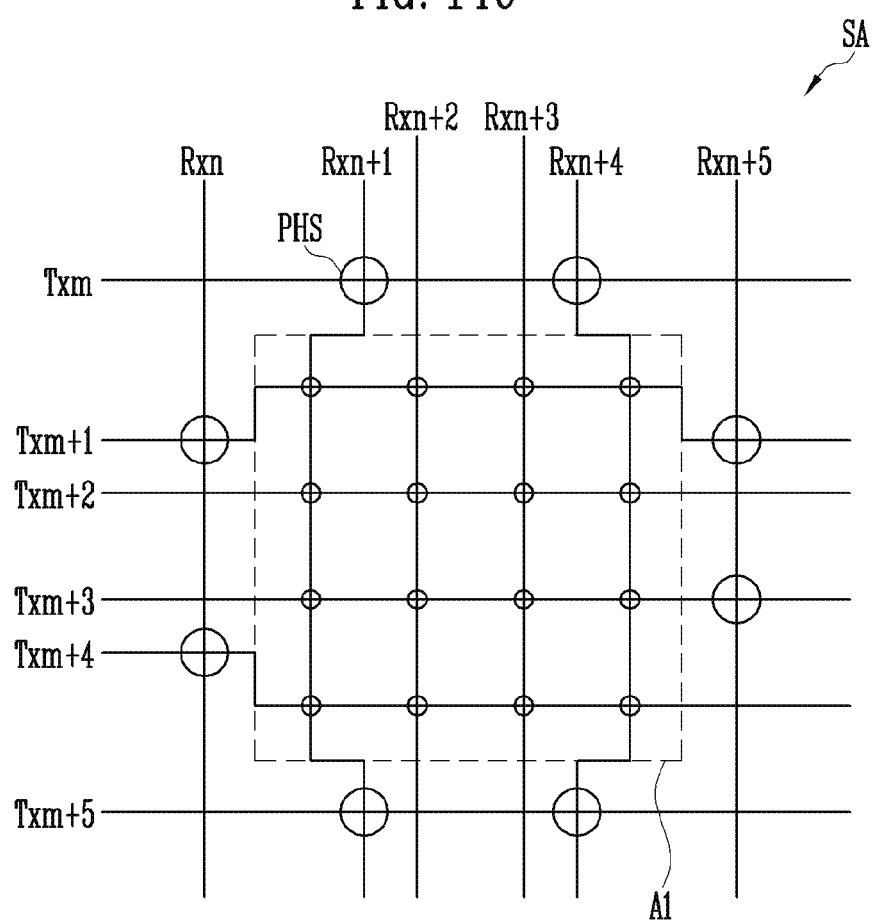

In an exemplary embodiment of the inventive concept, in the case where the area of each of the photo sensors PHS that are disposed in the second areas A2 is greater than that of each of the photo sensors PHS that are disposed in the first areas A1, the first group of horizontal sensing lines Tx may be bent in at least an area such that the photo sensors PHS disposed in the first areas A1 do not overlap with the photo sensors PHS disposed in the second areas A2, as illustrated in FIG. 14C.

For example, in FIGS. 14B and 14C, vertical sensing lines Rxn+1 and Rxn+4 each include a first bent portion when transitioning from a second area A2 to a first area A1, and a second bent portion when transitioning from the first area A1 to another second A2, horizontal sensing lines Txm+1 and Txm+4 each include a first bent portion when transitioning from a second area A2 to a first area A1, and a second bent portion when transitioning from the first area A1 to another second A2.

Figure 14D:
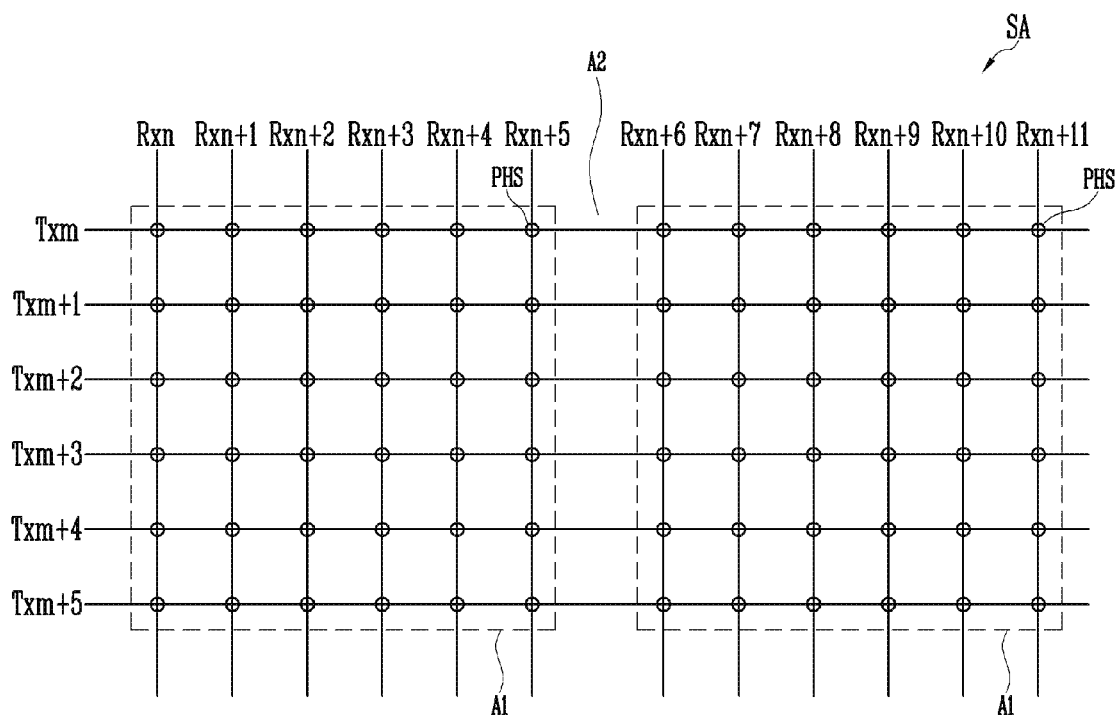

In an exemplary embodiment of the inventive concept, in the case where the photo sensors PHS are not disposed in the second areas A2, as illustrated in FIG. 14D, the numbers of photo sensors PHS that are coupled to the respective horizontal sensing lines Tx may be the same. In this exemplary embodiment, at least some of the horizontal sensing lines Tx may be disposed to be spaced apart from each other in the second areas A2. The distance between the horizontal sensing lines Tx may be determined in various ways depending on whether the target areas TA overlap with each other, the sizes of the target areas TA, and the sizes of the first areas and the second areas.

As illustrated in FIGS. 14A to 14D, the first group of vertical sensing lines Rx includes the n+1-th to n+4-th vertical sensing lines Rxn+1 to Rxn+4, and the second group thereof includes the n-th and n+5-th vertical sensing lines Rxn and Rxn+5. In exemplary embodiments of the inventive concept, the number of photo sensors PHS that is coupled to the first group of vertical sensing lines Rx is greater than that coupled to the second group.

In these exemplary embodiments, the first group of vertical sensing lines Rx may at least partially overlap with the first areas A1 illustrated in FIGS. 9A to 12. Furthermore, the second group of vertical sensing lines Rx does not overlap with the first areas A1 illustrated in FIGS. 9A to 12. However, the technical spirit of the inventive concept is not limited thereto. In other words, the second group of vertical sensing lines Rx may also at least partially overlap with the first areas A1 illustrated in FIGS. 9A to 12. However, in this exemplary embodiment, the area in which the first group of vertical sensing lines Rx overlaps with the first areas A1 is greater than the area in which the second group overlaps with the first areas A1.

In this exemplary embodiment, the number of photo sensors PHS that are coupled to the first group of vertical sensing lines Rx is greater than that coupled to the second group. The connection relationship between the vertical sensing lines Rx and the photo sensors PHS is the same as that described for the horizontal sensing lines Tx with reference to FIGS. 14A to 14D; therefore, further explanation thereof will be omitted.

Although FIGS. 14A to 14D illustrate exemplary embodiments in which the horizontal sensing lines Tx and the vertical sensing lines Rx are arranged in the same shape, the technical spirit of the inventive concept is not limited thereto. In exemplary embodiments, the arrangement shape of the horizontal sensing lines Tx and the vertical sensing lines Rx may be modified in various ways depending on the array state of the photo sensors PHS.

For example, in an exemplary embodiment in which photo sensors PHS disposed in portions of the second areas A2 are aligned with the photo sensors PHS disposed in the first areas A1 and photo sensors PHS disposed in the other portions of the second areas A2 are not aligned with the photo sensors PHS disposed in the first areas A1, the horizontal sensing lines Tx and/or the vertical sensing lines Rx may be disposed in an area in the same manner as that illustrated in FIG. 14A and disposed in the other area in the same manner as that illustrated in FIG. 14B.

Alternatively, for example, in an exemplary embodiment in which photo sensors PHS disposed in portions of the second areas A2 have the same size as that of the photo sensors PHS disposed in the first areas A1 and photo sensors PHS disposed in the other portions of the second areas A2 have sizes greater than that of the photo sensors PHS disposed in the first areas A1, the horizontal sensing lines Tx and/or the vertical sensing lines Rx may be disposed in an area in the same manner as that illustrated in FIG. 14A or 14B and disposed in the other area in the same manner as that illustrated in FIG. 14C.

As described above, in a fingerprint sensor and a display device including the fingerprint sensor in accordance with an exemplary embodiment of the inventive concept, high resolution photo sensors are arranged in only some areas in a sensor layer, and low resolution photo sensors may be arranged in the other areas or no photo sensor may be provided therein. Therefore, the production cost of the display device may be reduced.

While the inventive concept has been shown and described with reference to exemplary embodiments thereof, those of ordinary skill in the art will readily appreciate that modifications in form and details may be made thereto without materially departing from spirit and scope of the inventive concept.

What is claimed is:

1. A fingerprint sensor comprising:
a first layer comprising a plurality of pixels;
a light transmitting hole array layer including a plurality of light transmitting holes providing light transmitting paths of light rays that are incident through the first layer; and
a sensor layer including a plurality of photo sensors configured to sense the light rays that pass through the light transmitting holes and are incident on the sensor layer,
wherein a resolution at which the photo sensors are disposed in first areas on the sensor layer is higher than a resolution at which the photo sensors are disposed in second areas on the sensor layer,
wherein a target area of the sensor layer includes one of the first areas overlapping one of the light transmitting holes and located adjacently between two of the second areas that do not overlap any of the light transmitting holes.

2. The fingerprint sensor according to claim 1, wherein a pitch between the photo sensors that are disposed in the second areas is greater than a pitch between the photo sensors that are disposed in the first areas.

3. The fingerprint sensor according to claim 1, wherein an area of each of the photo sensors that are disposed in the second areas is greater than an area of each of the photo sensors that are disposed in the first areas.

4. The fingerprint sensor according to claim 1, wherein a number of the photo sensors in each of the first areas is higher than a number of the photo sensors disposed in each of the second areas.

5. The fingerprint sensor according to claim 1, wherein the first areas and the second areas form target areas on which the light rays passing through the light transmitting holes are incident.

6. The fingerprint sensor according to claim 5, wherein the first areas are respective central areas of the target areas, and wherein the second areas are respective perimeter areas of the target areas other than the central areas.

7. The fingerprint sensor according to claim 5, wherein each of the first areas at least partially overlaps with a corresponding one of the light transmitting holes.

8. The fingerprint sensor according to claim 5, wherein the target areas at least partially overlap with each other, and wherein the second areas comprise areas in which the target areas overlap with each other.

9. The fingerprint sensor according to claim 5, wherein the target areas do not overlap with each other, and wherein the sensor layer further includes third areas located in areas of the sensor layer other than the target areas.

10. The fingerprint sensor according to claim 9, wherein a resolution at which the photo sensors are disposed in at least one of the first, second, and third areas differs from a resolution at which the photo sensors are disposed in at least one remaining areas thereof.

11. The fingerprint sensor according to claim 10, wherein a resolution at which the photo sensors are disposed in each of the third areas is equal to or lower than a resolution at which the photo sensors are disposed in each of the second areas.

12. The fingerprint sensor according to claim 10, wherein the photo sensors are not disposed in the third areas.

13. The fingerprint sensor according to claim 1, wherein the first layer comprises:
 a circuit element layer comprising a plurality of circuit elements constituting a pixel circuit of each of the pixels; and
 a light emitting element layer on which light emitting elements for the pixels are located.

14. The fingerprint sensor according to claim 1, wherein the photo sensors are coupled both to first sensing lines configured to receive driving signals and to second sensing lines configured to output sensing signals in response to the sensed light rays.

15. The fingerprint sensor according to claim 14, wherein a number of the photo sensors that are electrically coupled to a first group of the first sensing lines is greater than a number of the photo sensors that are electrically coupled to a second group of the first sensing lines, and wherein a number of the photo sensors that are electrically coupled to a first group of the second sensing lines is greater than a number of the photo sensors that are electrically coupled to a second group of the second sensing lines.

16. The fingerprint sensor according to claim 15, wherein the first group of first sensing lines and the first group of second sensing lines are electrically coupled to the photo sensors that are disposed in the first areas.

17. The fingerprint sensor according to claim 16, wherein a first sensing line of the first group of first sensing lines electrically couples at least one of the photosensors disposed in a first area of the first areas to one of the photosensors disposed in a second area of the second areas and a second sensing line of the first group of second sensing lines electrically couples at least one of the photo sensors disposed in the first area to one of the photo sensors disposed in the second area.

18. The fingerprint sensor according to claim 17, wherein the first sensing line and the second sensing line are bent between the first area and the second area.

19. A display device comprising:
 a display panel comprising a plurality of pixels and a light transmitting hole array layer including a plurality of light transmitting holes providing light transmitting paths of light rays that are incident from the outside; and
 a sensor layer disposed on one surface of the display panel and including a plurality of photo sensors configured to sense the light rays that are incident through the display panel,
 wherein a resolution at which the photo sensors are disposed in first areas on the sensor layer is higher than a resolution at which the photo sensors are disposed in second areas on the sensor layer,
 wherein a target area of the sensor layer includes one of the first areas overlapping one of the light transmitting holes and located adjacently between two of the second areas that do not overlap any of the light transmitting holes.

20. The display device according to claim 19, wherein the first areas and the second areas form target areas on which the light rays passing through the light transmitting holes are incident, wherein the first areas are respective central areas of the target areas, and wherein the second areas are respective perimeter areas of the target areas other than the central areas.

21. The display device according to claim 20, wherein the target areas at least partially overlap with each other, and wherein the second areas comprise areas in which the target areas overlap with each other.

22. The display device according to claim 20, wherein the target areas do not overlap with each other, and wherein the sensor layer further includes third areas formed in areas of the sensor layer other than the target areas.

23. The display device according to claim 22, wherein a resolution at which the photo sensors are disposed in at least one of the first, second, and third areas differs from a resolution at which the photo sensors are disposed in at least one remaining areas thereof.

\* \* \* \* \*